(12) United States Patent
Sakakima

(10) Patent No.: US 7,450,348 B2
(45) Date of Patent: Nov. 11, 2008

(54) ELECTRONIC DEVICE, MAGNETORESISTANCE EFFECT ELEMENT; MAGNETIC HEAD, RECORDING/REPRODUCING APPARATUS, MEMORY ELEMENT AND MANUFACTURING METHOD FOR ELECTRONIC DEVICE

(75) Inventor: Hiroshi Sakakima, Kyotanabe (JP)

(73) Assignee: Panasonic Corporation, Osaka (JP)

( * ) Notice: Subject to any disclaimer, the term of this patent is extended or adjusted under 35 U.S.C. 154(b) by 580 days.

(21) Appl. No.: 10/875,838

(22) Filed: Jun. 24, 2004

(65) Prior Publication Data

US 2004/0264064 A1 Dec. 30, 2004

Related U.S. Application Data

(60) Provisional application No. 60/491,921, filed on Aug. 1, 2003.

(30) Foreign Application Priority Data

Jun. 25, 2003 (JP) .............................. 2003-180810

(51) Int. Cl.
*G11B 5/40* (2006.01)
(52) U.S. Cl. ...................................... 360/313
(58) Field of Classification Search ........................ None
See application file for complete search history.

(56) References Cited

U.S. PATENT DOCUMENTS 6,631,056 B1 * 10/2003 Asatani et al. .............. 360/323
2002/0163079 A1 11/2002 Awano 2003/0020025 A1 1/2003 Nakayama et al.

FOREIGN PATENT DOCUMENTS

JP 5-90569 4/1993

(Continued)

OTHER PUBLICATIONS

M.N. Baibich et al., "Giant Magnetoresistance of (001) Fe/(001) Cr Magnetic Superlattices", Physical Review Letters, No. 21, vol. 61, p. 2472 (1988).

(Continued)

*Primary Examiner*—Mark Blouin
(74) *Attorney, Agent, or Firm*—Hamre, Schumann, Mueller & Larson, P.C.

(57) ABSTRACT

An electronic device free from variation of conductivity is provided. The electronic device 100 includes electrodes 2 and 3; and a metal conductor thin film 7 electrically connected to the electrodes 2 and 3. The metal conductor thin film 7 includes a metal conductor portion 1 that bridges a gap between the electrodes 2 and 3. The bridge length L of the metal conductor portion 1 is not more than a mean free path Λ of electron in the metal conductor portion 1 at the operation temperature of the electronic device 1. The electronic device 100 is formed by forming the electrodes 2 and 3 on the substrate 8 with a gap having the bridge length L; forming a support 4 that includes at least one selected from the group consisting of a nano-tube and a nano-wire and bridges a gap between the electrodes 2 and 3; and forming the metal conductor portion 1 by depositing the metal conductor thin film 7 on the support 4, and the electrodes 2 and 3.

32 Claims, 23 Drawing Sheets

FOREIGN PATENT DOCUMENTS

| | | |
|---|---|---|
| JP | 2003-8105 | 1/2003 |
| WO | 97-47982 | 12/1997 |
| WO | 01/39292 | 5/2001 |
| WO | 02/063693 | 8/2002 |
| WO | 03/048433 | 6/2003 |

OTHER PUBLICATIONS

T. Miyazaki et al., "Giant magnetic tunneling effect in $Fe/Al_2O_3/Fe$ junction", Journal of Magnetism and Magnetic Materials 139 (1995) L231.

Tsukagoshi et al. "Coherent transport of electron spin in a ferromagnetically contacted carbon nanotube", Letters of Nature vol. 401 (1999) p. 572.

Franklin et al., Advanced Materials vol. 12 (2000) p. 890.

Hua et al. "100,000% ballistic magnetoresistance in stable Ni nanocontacts at room temperature", Physical Review B 67 (2003) p. 60401.

S. Frank et al., "Carbon Nanotube Quantum Resistors", Science vol. 280 (1998) p. 1744.

Prinz, Gary A., "Magnetoelectronics applications", Journal of magnetism and Magnetic Materials 200 (1999) 57-68.

Zhang, et al., "Formation of Metal nanowires on suspended single-walled carbon nanotubes" Applied Physics Letters, vol. 77, No. 19, Nov. 2000, pp. 3015-3017.

Hua, et al., "100,000% ballistic magnetoresistance in stable Ni nanocontacts at room temperature", Physical Review B 67, pp. 060401-1-060401-4, 2003.

* cited by examiner

ELECTRONIC DEVICE, MAGNETORESISTANCE EFFECT ELEMENT; MAGNETIC HEAD, RECORDING/REPRODUCING APPARATUS, MEMORY ELEMENT AND MANUFACTURING METHOD FOR ELECTRONIC DEVICE

This application is a Non-Provisional application of Ser. No. 60/491,921, filed Aug. 1, 2003, which application is incorporated herein by reference.

BACKGROUND OF THE INVENTION

1. Field of the Invention

The present invention relates to an electronic device having a fine shape controlled in the nanometer order, a magnetoresistance effect element having a fine shape controlled in the nanometer order; a magnetic head, a recording/reproducing apparatus, a memory element and a memory array using the magnetoresistance effect element; a method for manufacturing the electronic device; and a method for manufacturing the magnetoresistance effect element.

2. Description of Related Art

A nanotechnology for controlling the structure of a material on the order of nanometers has been valued as a basic technology of information and communication, etc., and research and development have been carried out actively. In recent years, magnetic devices and electronic devices having a fine shape controlled on the order of nanometers have been proposed.

In the field of a magnetic device, since the MR ratio (magnetoresistance change) of a conventional magnetoresistance effect element using a GMR (giant magnetoresistance effect) film (M. N. Baibich et al., "Phys. Rev. Lett., Vol. 61" (1988) p.2472) is only about 10%, magnetoresistance effect elements exhibiting a higher MR ratio have been demanded. A magnetoresistance effect element using a TMR (tunnel magnetoresistance) element, which was proposed with respect to the demand mentioned above, exhibits a high MR ratio of about 50% (T. Miyazaki et al., "J. Magn. Mater., Vol. 139" (1995), pL231). The resistance of the TMR element is inversely proportional to the square of the TMR element width, which is proportional to the track width of an information recording medium. Since the width of the TMR element becomes narrower as the recording density is higher and the track width is narrower, the resistance of the TMR element becomes extremely high. Therefore, it is difficult to apply the element to the fine structured magnetic head.

Furthermore, a magnetic resistance memory (MRAM) using a TMR film has been proposed. However, the MR ratio of the magnetic resistance memory using the TMR film is about 50%, which is insufficient as a memory element.

In such circumstances, there is an attempt to manufacture a magnetoresistance effect element in which a connection portion having a fine shape controlled on the order of nanometers is formed between electrodes and a ballistic conduction capable of allowing electrons to pass through without being scattered is carried out at the connecting portion. In a conventional lithography technology, it is extremely difficult to form a fine shape controlled on the order of nanometers. By using a carbon nano-tube hereinafter, also referred to as CNT) a configuration in which a connection portion of a fine shape controlled on the order of nanometers is formed between electrodes has been proposed ("Nature Vol. 401" (1999), p572, hereinafter will be referred to as non-patent document 3). In this document, a magnetoresistance effect element for electrically connecting two electrodes via a carbon nano-tube is disclosed.

In the field of electronic devices, an electronics device in which the variation of conductance is eliminated has been proposed by controlling the cross sectional area of the wiring by the use of a phenomenon called quantum conductance in which the conductance with respect to the cross sectional area of the fine wiring changes stepwise. The variation of conductance is generated when the conductance with respect to the cross sectional area of the wire is changed continuously. An electronic device having such a fine wiring formed of carbon nano-tube was proposed in Adv. Mater. Vol. 12, 2000, p890, which hereinafter will be referred to as non-patent document 4.

Furthermore, in a nano-contact element using Ni whisker, the MR ratio is reported to be 100,000% at room temperature (see Physical Review B67, 2003, p60401, which hereinafter will be referred to as non-patent document 5)

However, the conductivity of the carbon nano-tube differs depending upon the chirality, so that it is difficult to control the formed carbon nano-tube becoming an arm-chair type exhibiting a property of metal property or a zigzag type exhibiting a property of a semiconductor or a chiral type exhibiting a property of an insulator.

Therefore, in a configuration of the magnetoresistance effect element disclosed in the non-patent document 3, since it is not possible to control the conductivity of a carbon nano-tube formed for connecting two electrodes, the electric property is not stable. If a carbon nano-tube can be formed in the shape of an arm chair type exhibiting a metal conductivity, contact resistance between the carbon nano-tube and the two electrodes becomes extremely high such as 15 to 30 MΩ in the case where the electrode is a Ni electrode. Therefore, this configuration has a problem that the MR ratio of the magnetoresistance effect element is just 10% at an extremely low temperature and that high MR ratio cannot be obtained at room temperature.

In order to obtain an electronic device that is free from variation of conductivity by controlling a cross sectional area of a fine wiring controlled in the nanometer order, also in the configuration having a wiring carbon nano-tube of the non-patent document 4, it is not possible to control the conductivity of the carbon nano-tube as mentioned above. Since there is a problem that the electronic stability is low, it is not suitable for practical use. Furthermore, the resistance is as high as 10 kΩ.

In a nano-contact element using Ni whisker disclosed in the document 5, a nano-contact portion formed of plating has a structure that cannot be controlled. Therefore, it is not possible to use it practically.

SUMMARY OF THE INVENTION

With the foregoing in mind, it is an object of the present invention to provide an electronic device having a fine shape controlled on the order of nanometers, a magnetoresistance effect element; a magnetic head, a recording/reproducing apparatus, a memory element and a memory array using the magnetoresistance effect element; a method for manufacturing the electronic device; and a method for manufacturing the magnetoresistance effect element.

The first electronic device of the present invention includes a first electrode and a second electrode; and a metal conductor thin film electrically connected to the first electrode and the second electrode. The metal conductor thin film comprises a metal conductor portion that bridges a gap between the first electrode and the second electrode seen from the direction perpendicular to the bottom surfaces of the first electrode and the second electrode; a bridge length L of the metal conductor portion is not more than a mean free path Λ of electron in the metal conductor portion at the operation temperature of the electronic device. The electronic device is manufactured by: forming the first electrode and the second electrode on a substrate with a gap having the bridge length L; forming a support that includes at least one selected from the group consisting of a nano-tube and a nano-wire and bridges a gap between the first electrode and the second electrode seen from the direction perpendicular to the bottom surfaces; and forming the metal conductor portion by a method of depositing the metal conductor thin film on the support and on the first electrode and the second electrode.

In the specification, the phrase "mean free path Λ of electron" denotes a distance in which electron can travel without being scattered. The phrase "bridge length L of a metal conductor portion" denotes a length along the central axis from a point P1 in which a cross-sectional area along the central axis of the electronic device rapidly is decreased to a point P2 in which a cross-sectional area of the electronic device rapidly is increased. Specifically, the method for measuring the bridge length L of the metal conductor portion will be explained in detail in the embodiments.

Since the first electronic device according to the present invention is manufactured by forming the first electrode and the second electrode on the substrate with a gap having the bridge length L that is not more than a mean free path Λ of electron in the metal conductor portion at the operation temperature of the electronic device; forming a support that includes at least one selected from the group consisting of a nano-tube and a nano-wire and bridges a gap between the first electrode and the second electrode seen from the direction perpendicular to the bottom surfaces; and forming the metal conductor portion by a method of depositing the metal conductor thin film on the support, on the first electrode and the second electrode, it is possible to form the metal conductor portion having the bridge length L that is not more than the mean free path Λ of electron on the support including at least one selected from the group consisting of a nano-tube and a nano-wire.

In the metal conductor portion having the bridge length L that is not more than the mean free path Λ of electron, a phenomenon called quantum conductance in which the conductance with respect to the cross sectional area changes stepwise appears.

Since the metal conductor portion of the present invention is formed of metal, unlike the carbon nano-tube described in non-patent document 4 that is not capable of controlling the conductivity, the metal conductor portion of the present invention has a stable conductivity. Furthermore, the contact resistance to the first electrode and the second electrode becomes extremely small. Therefore, the electric property becomes stable.

Therefore, by controlling the cross-sectional area of the metal conductor portion by the use of the quantum conductance, it is possible to obtain an electronic device free from the variation of the conductivity generated in the case where the conductivity with respect to the cross-sectional area changes linearly.

It is preferable that the electronic device is manufactured by a process of depositing the metal conductor thin film and then removing the support. By removing the support that is not capable of controlling the conductivity, the electric property of the electronic device is more stable.

The electronic device may be manufactured by a process of depositing the metal conductor thin film and then removing the substrate. When the CNT is used for the substrate, since the CNT of the substrate shows three kinds of properties of a conductor, a semiconductor and an insulator, by removing the substrate composed of CNT, the electric property of the electronic device becomes more stable.

It is preferable that the first electrode and the second electrode comprise a magnetic substance. It is advantageous because the electronic device can be used as a magnetoresistance effect element and a memory element.

It is preferable that the first electrode and the second electrode comprise at least one element selected from the group consisting of Fe, Co and Ni. It is advantageous because it is possible to obtain a magnetoresistance effect element and a memory element having an excellent magnetic property.

It is preferable that the metal conductor thin film comprises a magnetic substance. Since a magnetic domain wall can be pinned to the metal conductor portion, it is possible to obtain a magnetoresistance effect element that operates in accordance with either the presence or absence of the magnetic domain wall.

It is preferable that the metal conductor thin film comprises at least one element selected from the group consisting of Fe, Co and Ni. The magnetic domain wall can be pinned on the metal conductor portion securely. It is preferable that the cross-sectional area Si of the first electrode, the cross-sectional area S2 of the second electrode and the cross-sectional area S3 of the metal conductor portion satisfy the following relationship:

$$S3<S1 \text{ and } S3<S2.$$

The magnetic domain wall can be pinned on the metal conductor portion securely.

It is preferable that the cross-sectional area S3 of the metal conductor portion is 1 nm$^2$ or more and $1.0 \times 10^6$ nm$^2$ or less. When the cross-sectional area S3 is less than 1 nm$^2$, it tends to be difficult to form the metal conductor portion controlled on the order of nanometers with high reproducibility. When the cross-sectional area S3 is more than $1.0 \times 10^6$ nm$^2$, it tends to be difficult to realize the quantum conductance.

It is preferable that the support comprises a carbon nano-tube. With a carbon nano-tube, it is possible to control a fine shape of the support easily. Furthermore, it is possible to precisely control the shape of the metal conductor portion in a desirable manner. Since the carbon nano-tube has high thermal resistance as compared with a material such as protein nano-wire, etc. containing an organic substance and has high mechanical strength, it can be manufactured easily.

It is preferable that the step of forming the support comprises providing a catalyst for promoting the formation reaction of the carbon nano-tube on the first electrode and the second electrode; and forming the support comprising the carbon nano-tube by a chemical vapor deposition (CVD) method. The carbon nano-tube can be produced easily.

It is preferable that the step of forming the support comprises forming the support comprising the carbon nano-tube while applying different voltages to the first electrode and the second electrode, respectively. It is advantageous because an electric field is provided between the first electrode and the second electrode, thus making it possible to form the carbon-nano tube easily.

It is preferable that the first electrode and the second electrode comprise a magnetic substance; and the catalyst comprises at least one element selected from the group consisting of Fe, Co and Ni. Since Fe, Co and Ni are magnetic substances, if the magnetic substances remain in the first and second electrodes after the electronic device is manufactured, the electric property and the magnetic property are not deteriorated.

The support may comprise at least one of a self-organizable protein nano-wire and silicon nano-wire. By controlling DNA of the protein nano-wire, a fine shape of the support can be controlled precisely. Furthermore, a fine shape of the metal conductor portion can be controlled to a desirable shape precisely.

It is preferable that the step for forming the metal conductor portion comprises depositing the metal conductor thin film by a physical vapor deposition (PVD) method. With a physical vapor deposition (PVD) method, the metal conductor portion can be formed easily.

It is preferable that an operation temperature of the electronic device is 4.2 K or more and 523 K or less. If the operation temperature is less than 4.2 K, a system for cooling the electronic device tends to be complicated, and the cost tends to rise greatly because of using an expensive cooling medium such as liquid He. If the operation temperature is more than 523 K, peripheral equipment (peripheral equipment such as semiconductor element, magnetic medium, etc. used in combination of the electronic device) that can be used at an operation temperature of more than 523 K is extremely limited. Therefore, peripheral equipment that is excellent in weather resistance (thermal resistance, etc.) must be used. When the operation temperature is 4.2 K or more and 523 K or less, by controlling the cross-sectional area of the metal conductor portion by the use of the quantum conductance, while using an advantage of the present invention, that is, it is possible to avoid the variation in conductivity that occurred when the conductivity with respect to the cross sectional area of the metal conductor portion shows continuous values, the performance of the other peripheral equipment can be ensured. Thus, a desirable performance of the apparatus as a whole can be obtained.

The second electronic device of the present invention includes a first electrode and a second electrode; and a metal conductor that bridges a gap between the first electrode and the second electrode. The bridge length L of the metal conductor portion is not more than a mean free path Λ of electron in the metal conductor at the operation temperature of the electronic device. The electronic device is manufactured by: forming the first electrode and the second electrode on a substrate with a gap having the bridge length L; forming a support that includes at least one selected from the group consisting of a nano-tube and a nano-wire and bridges a gap between the first electrode and the second electrode; and depositing the metal conductor on the support.

In the second electronic device of the present invention, the first electrode and the second electrode are formed on the substrate with a gap having the bridge length L; the support that includes at least one selected from the group consisting of a nano-tube and a nano-wire and bridges a gap between the first electrode and the second electrode is formed; and the metal conductor is deposited on the support. It is possible to form the metal conductor that has the bridge length L that is not more than the mean free path Λ of electron and directly bridges the first electrode and the second electrode on the support that includes at least one selected from the group consisting of the nano-tube and the nano-wire and directly bridges between the first electrode and the second electrode.

In the second electronic device of the present invention, similar to the first electronic device of the present invention, in the metal conductor, a phenomenon called quantum conductance appears. The metal conductor is different from the carbon nano-tube described in the non-patent document 4 and has a stable conductivity. Furthermore, the contact resistance to the first electrode and the second electrode is reduced. Therefore, by using the quantum conductance, by controlling the cross sectional area of the metal conductor portion, an electronic device free from variation in conductivity can be obtained.

The third electronic device of the present invention includes a first electrode film; an insulating film formed on the first electrode film; a second electrode film formed on the insulating film; and a metal conductor penetrating the insulating film and electrically connecting the first electrode film and the second electrode film. The length L of the metal conductor is not more than a mean free path Λ of electron in the metal conductor at the operation temperature of the electronic device. The electronic device is manufactured by: forming the first electrode film on the substrate; forming the insulating film on the first electrode film to the thickness that is the length L of the metal conductor; providing the insulating film with a through hole reaching the first electrode thin film by irradiating the insulating film with a field emission electron beam from a probe of a scanning tunneling microscope (STM) that includes at least one selected from the group consisting of a nano-tube and a nano-wire; filling the inside of the through hole with the metal conductor; and forming the second electrode film on the insulating film and the metal conductor.

In the third electronic device of the present invention, the electronic device is manufactured by forming the first electrode film on the substrate; forming the insulating film on the first electrode film to the thickness that is the length L of the metal conductor; providing the insulating film with the through hole reaching the first electrode thin film by irradiating the insulating film with the field emission electron beam from the probe of the scanning tunneling microscope (STM) that includes at least one selected from the group consisting of the nano-tube and the nano-wire; filling the inside of the through hole with the metal conductor; and forming the second electrode film on the insulating film and the metal conductor film. Therefore, in the through hole formed by irradiating with field emission beams from the probe of STM including at least one selected from the group consisting of the nano-tube and the nano-wire, it is possible to manufacture a metal conductor having the length L of not more than the mean free path Λ of electron.

Thus, in the metal conductor having a fine shape controlled on the order of nanometers, a phenomenon occurs called quantum conductance in which the conductivity (conductance) with respect to the cross-sectional area changes stepwise, and a phenomenon occurs called ballistic conduction in which an electron passes through the metal conductor without being scattered appear.

Since the metal conductor of the present invention is formed of metal, unlike the carbon nano-tube described in the non-patent document 4 that is not capable of controlling the conductivity, it has stable conductivity. Furthermore, the contact resistance to the first electrode film and the second electrode film is greatly reduced. Therefore, the electric property becomes stable.

Therefore, by controlling the cross-sectional area of the metal conductor by using the quantum conductance, it is possible to obtain an electronic device capable of avoiding the variation of the conductivity occurred when the conductivity with respect to the cross-sectional area is linearly changed. Furthermore, by controlling the magnetization directions of the first electrode film and the second electrode film, the magnetoresistance effect element having an extremely high MR ratio may be obtained owing to the ballistic conduction.

The fourth electronic device according to the present invention includes a first electrode and a second electrode; and an insulating film formed in contact with the first electrode and the second electrode between the first electrode and the second electrode. The insulating film is provided with a groove that reaches from the first electrode to the second electrode; the groove is filled with the metal conductor that is brought into contact with the first electrode and the second electrode; and the length L of the metal conductor is not more than a mean free path $\Lambda$ of electron in the metal conductor at the operation temperature of the electronic device. The electronic device is manufactured by forming the first electrode and the second electrode on a substrate arranged with a gap having the length L. The insulating film is in brought into contact with the first electrode and the second electrode between the first electrode and the second electrode on the substrate. The insulating film is provided with the groove reaching from the first electrode to the second electrode by irradiating the insulating film with a field emission electron beam from a probe of the scanning tunneling microscope (STM) that includes at least one selected from the group consisting of a nano-tube and a nano-wire; and filling the groove with the metal conductor.

The fourth electronic device of the present invention is manufactured by forming the first electrode and the second electrode on the substrate arranged with a gap having the bridge length L. The insulating film is brought into contact with the first electrode and the second electrode between the first electrode and the second electrode on the substrate. The insulating film is provided with the groove reaching from the first electrode thin film to the second electrode thin film by irradiating the insulating film with a field emission electron beam from the probe of the scanning tunneling microscope STM that includes at least one selected from the group consisting of the nano-tube and the nano-wire; and filling the groove with the metal conductor. Therefore, in the groove formed by irradiating with field emission beams from the probe of STM including at least one selected from the group consisting of the nano-tube and the nano-wire, it is possible to manufacture a metal conductor having the length L of not more than the mean free path $\Lambda$ of electron.

Thus, in the metal conductor having a fine shape controlled on the order of nanometers, a phenomenon occurs called quantum conductance in which the conductivity (conductance) with respect to the cross-sectional area changes stepwise, and a phenomenon occurs called ballistic conduction in which an electron passes through the metal conductor without being scattered appear.

Since the metal conductor of the present invention is formed of metal, unlike the carbon nano-tube described in the non-patent document 4 that is not capable of controlling the conductivity, it has stable conductivity. Furthermore, the contact resistance to the first electrode film and the second electrode film is extremely reduced. Therefore, the electric property becomes stable.

Therefore, by controlling the cross-sectional area of the metal conductor by using the quantum conductance, it is possible to obtain an electronic device capable of avoiding the variation of the conductivity that occurrs when the conductivity with respect to the cross-sectional area is linearly changed. Furthermore, by controlling the magnetization directions of the first electrode and the second electrode, the magnetoresistance effect element having an extremely high MR ratio may be obtained owing to the ballistic conduction.

It is preferable that the first electrode and the second electrode comprise a magnetic substance; and the metal conductor is provided with a concave portion. When the electronic device is used for the magnetoresistance effect element by forming a concave portion, a magnetic domain wall can be pinned to the site of the concave portion of the metal conductor securely. By forming the concave portion, a portion in which the cross-sectional area rapidly is decreased can be formed in the metal conductor portion, and the position of the magnetic domain wall can be fixed to this site. When it is required to reduce the noise generated during the operation of the electronic device, this configuration is effective. The present inventors have confirmed that this concave portion can be formed by using STM.

The magnetoresistance effect element according to the present invention includes a first electrode and a second electrode comprising a magnetic substance; and a metal conductor thin film electrically connected to the first electrode and the second electrode. The metal conductor thin film comprises a metal conductor portion that bridges a gap between the first electrode and the second electrode seen from the direction perpendicular to the bottom surfaces of the first electrode and the second electrode. The bridge length L of the metal conductor portion is not more than a value that is a larger value of the value of the length of electron spin diffusion in the metal conductor portion at the operation temperature of the magnetoresistance effect element and the value of mean free path $\Lambda$ of electron in the metal conductor portion at the operation temperature of the magnetoresistance effect element. The cross-sectional area S1 of the first electrode, the cross-sectional area S2 of the second electrode and the cross-sectional area S3 of the metal conductor portion satisfy the following relationship: S3<S1 and S3<S2. The magnetoresistance effect element is manufactured by: forming the first electrode and the second electrode on the substrate with a gap having the bridge length L; forming a support that includes at least one selected from a group consisting of a nano-tube and a nano-wire and bridges a gap between the first electrode and the second electrode seen from the direction perpendicular to the bottom surfaces; and forming the metal conductor portion by a method of depositing the metal conductor thin film on the support, on the first electrode and the second electrode.

The "length of electron spin diffusion" in the present invention is the distance in which an electron can travel with the magnetization state (up spin state or down spin state) maintained.

In the magnetoresistance effect element according to the present invention, the electronic device is manufactured by forming the first electrode and the second electrode on the substrate with a gap having the bridge length L, which is not more than a value that is the larger of the value of the length of electron spin diffusion in the metal conductor portion at the operation temperature of the magnetoresistance effect element and the value of mean free path $\Lambda$ of electron in the metal conductor portion at the operation temperature of the magnetoresistance effect element; forming the support that includes at least one selected from the group consisting of the nanotube and the nano-wire and bridges the gap between the first electrode and the second electrode seen from the direction perpendicular to the bottom surfaces; and forming the metal conductor portion by the method of depositing the metal conductor thin film on the support, on the first electrode and the second electrode. Therefore, it is possible to manufacture a metal conductor portion having the bridge length L of a value that is the larger of the value of the length of electron spin diffusion and the value of mean free path $\Lambda$ of electron on the support including at least one selected from the group consisting of the nano-tube and the nano-wire.

In the metal conductor portion having such a bridge length L, a phenomenon occurs called ballistic conduction in which an electron passes through the metal conductor portion without being scattered appear.

Since the metal conductor portion of the present invention is formed of metal, it has a stable conductivity unlike the carbon nano-tube described in the non-patent document 3 that is not capable of controlling the conductivity. Furthermore, the contact resistance between the first electrode and the second electrode becomes extremely small. Therefore, the electric property becomes stable.

Therefore, by controlling the magnetization directions of the first electrode and the second electrode, the magnetoresistance effect element having an extremely high MR ratio can be obtained owing to the ballistic conduction.

It is preferable that the magnetoresistance effect element is manufactured by depositing the metal conductor thin film and then removing the support. By removing the support that is not capable of controlling the conductivity, the electric property can be more stable. Furthermore, it is possible to reduce the contact resistance between the first electrode and the metal conductor portion and the contact resistance between the second electrode and the metal conductor portion can be reduced further.

The magnetoresistance effect element can be manufactured by a step of removing the substrate after depositing the metal conductor thin film. When the CNT is used for the substrate, the CNT of the substrate shows three kinds of properties of a conductor, a semiconductor and an insulator, and by removing the substrate composed of CNT, the electric property of the magnetoresistance effect element becomes more stable.

It is preferable that the first electrode comprises a free layer in which the magnetization is rotated easily with respect to an external magnetic field; the second electrode comprises a pinned layer in which the magnetization is not rotated easily with respect to an external magnetic field; and the magnetization easy axis of the free layer is perpendicular to the direction of the external magnetic field to be detected. With such a configuration, it is possible to improve the linearity of signals output from the magnetoresistance effect element.

As to the free layer, "the magnetization is rotated easily with respect to an external magnetic field" and as to the pinned layer, "the magnetization is not rotated easily with respect to an external magnetic field" denote respectively that the free layer is magnetization-rotated with respect to the external magnetic field applied to the magnetoresistance effect element but the pinned layer is not magnetization-rotated.

It is preferable that the pinned layer comprises an antiferromagnetic film; and a magnetic layer is formed on the antiferromagnetic film and pinned by the antiferromagnetic film, wherein the magnetic film is electrically connected to the metal conductor portion. According to this configuration, the property (MR ratio) of the magnetoresistance effect element is thermally stable.

It is preferable that the support includes a carbon nano-tube. With the carbon nano-tube, it is possible to control a fine shape of the support easily. Furthermore, a fine shape of the metal conductor portion can be controlled to a desirable shape precisely. Since the carbon nano-tube has high thermal resistance and high mechanical strength as compared with, for example, a protein nano-wire, etc. that is a material including an organic material, it can be manufactured easily.

It is preferable that the step of forming the support comprises providing a catalyst for promoting the formation reaction of the carbon nano-tube to the first electrode and the second electrode, and forming the support comprising the carbon nano-tube by a chemical vapor deposition (CVD) method. It is possible to form a carbon nano-tube easily.

It is preferable that the step for forming the support comprises forming the support comprising the carbon nano-tube while applying different voltages to the first electrode and the second electrode, respectively. It is possible to form a carbon nano-tube easily by forming an electric field between the first electrode and the second electrode.

It is preferable that the catalyst comprises at least one element selected from the group consisting of Fe, Co and Ni. Since Fe, Co and Ni are magnetic substances, even if the magnetic substance remains in the first and second electrodes after being manufactured, the electric property and magnetic property cannot be deteriorated.

The support may comprise at least one of a self-organizable protein nano-wire and silicon nano-wire. By controlling DNA of the protein nano-wire, the fine shape of the support can be controlled precisely. Furthermore, a fine shape of the metal conductor portion can be controlled to a desirable shape precisely.

It is preferable that the step for forming the metal conductor portion comprises depositing the metal conductor thin film by a physical vapor deposition (PVD) method. With a physical vapor deposition (PVD) method, a metal conductor portion can be formed easily.

It is preferable that the metal conductor thin film comprises at least one selected from the group consisting of Fe, Co and Ni. A magnetic domain wall can be pinned to the metal conductor portion securely.

It is preferable that the first electrode and the second electrode comprise at least one element selected from the group consisting of Fe, Co and Ni. A magnetoresistance effect element having an excellent magnetic property can be obtained.

It is preferable that an operation temperature of the magnetoresistance effect element is 4.2 K or more and 523 K or less. If the operation temperature is less than 4.2K, a system for cooling the electronic device tends to be complicated, and the cost tends to rise greatly because of using an expensive cooling medium such as liquid He. If the operation temperature is more than 523 K, peripheral equipment (peripheral equipment such as semiconductor element, magnetic medium, etc. used in combination of the electronic device) that can be used at an operation temperature of more than 523 K is extremely limited. Therefore, peripheral equipment that is excellent in weather resistance (thermal resistance, etc.) must be used. When the operation temperature is 4.2 K or more and 523 K or less, while using an advantage of the present invention, that is, it is possible to obtain high MR ratio easily and securely, the performance of the other peripheral equipment can be ensured. Thus, a desirable performance of the apparatus as a whole can be ensured.

The magnetic head according to the present invention includes a magnetoresistance effect element according to the present invention; a first lead wire electrically connected to the first electrode of the magnetoresistance effect element; and a second lead wire electrically connected to the second electrode of the magnetoresistance effect element.

The magnetic head according to the present invention is provided with a magnetoresistance effect element according to the present invention having a high MR ratio of 100% or more. Therefore, it is possible to obtain an extremely high sensitivity and an extremely high output.

The recording/reproducing apparatus according to the present invention includes a recording head for recording information in a magnetic media; and a reproducing head for reproducing information recorded on the magnetic media. The reproducing head is a magnetic head of the present invention.

In the recording/reproducing apparatus of the present invention, the magnetoresistance effect element of the present invention having an extremely high MR ratio of 100% or more is provided as the reproducing head. Therefore, it is possible to carry out high output with the recording head and to reproduce information recorded in the magnetic medium with high recording density of 100 Gb/inch$^2$ or more easily and precisely.

The first memory element of the present invention includes a magnetoresistance effect element according to the present invention. The first electrode of the magnetoresistance effect element comprises a free layer in which the magnetization is rotated easily with respect to an external magnetic field, and the second electrode comprises a pinned layer in which the magnetization is not rotated easily with respect to the external magnetic field. The memory element further comprises a word line generating an external magnetic field that changes the magnetization directions of the free layer and the pinned layer in parallel or in anti-parallel, based on an electric current; and an electric current supplier for supplying the word line with the electric current. Based on the external magnetic field generated from the word line, by changing the magnetization directions in parallel or in anti-parallel to each other, information is written in the magnetoresistance effect element; and by measuring the resistance of the magnetoresistance effect element, the information written in the magnetoresistance effect element is read out.

In the first memory element of the present invention, by inverting the magnetization direction of the free layer based on the external magnetic field generated from the word line, information is written in the magnetoresistance effect element. By measuring the resistance of the magnetoresistance effect element, information written in the magnetoresistance effect element can be read out. Since the magnetoresistance effect element is a magnetoresistance effect element of the present invention, an extremely high MR ratio can be realized as compared with a conventional magnetoresistance effect element having the MR ratio of about 60%.

The second memory element of the present invention includes a magnetoresistance effect element according to the present invention, and an electric current supplier for supplying either an electric current flowing in the metal conductor portion from the first electrode toward the second electrode, or an electric current flowing in the metal conductor portion from the second electrode toward the first electrode. By inverting the direction of an electric current flowing in the metal conductor portion of the magnetoresistance effect element so as to change the magnetization directions of the first electrode and the second electrode in parallel or in anti-parallel, information is written in the magnetoresistance effect element; and by measuring the resistance value of the magnetoresistance effect element that is different in accordance with the magnetization directions of the first electrode and the second electrode, the information written in the magnetoresistance effect element is read out.

In the second memory element of the present invention, by inverting the direction of current flowing in the metal conductor portion of the magnetoresistance effect element and by changing the magnetization direction into in parallel or in anti-parallel, information is written in the magnetoresistance effect element. By measuring the resistance value of the magnetoresistance effect element that is different in accordance with the magnetization direction of the first electrode and the second electrode, information written in the magnetoresistance effect element can be read out. Since the magnetoresistance effect element is a magnetoresistance effect element of the present invention, an extremely high MR ratio can be realized as compared with a conventional magnetoresistance effect element having the MR ratio of about 60%. Since the second memory element does not require a word line as a component element as in the first memory element of the present invention, a configuration can be made to be small and simple. Thus, it is possible to realize a memory element that has a simple and small-sized configuration in which the cell area is small, the space for installing the memory is small and the recording density is high.

It is preferable that the current density of the electric current supplied to the magnetoresistance effect element by the electric current supplier is $1.0 \times 10^5$ A/cm$^2$ or more. When the current density of the electric current supplied to the magnetoresistance effect element is $1.0 \times 10^5$ A/cm$^2$ or more, information can be written in the magnetoresistance effect element easily and securely. When the current density is less than $1.0 \times 10^5$ A/cm$^2$, information cannot written securely.

The memory array of the present invention includes magnetoresistance effect elements according to the present invention arranged in a matrix; wiring for writing information in magnetoresistance effect elements independently and reading out the information; a write unit for writing information in the magnetoresistance effect element independently via the wiring by inverting the direction of the electric current flowing in the metal conductor portion of the magnetoresistance effect element so as to change the magnetization directions of the first electrode and the second electrode in parallel or in anti parallel; and a read unit for reading out independently the information written in the magnetoresistance effect element via the wiring by measuring the resistance value of the magnetoresistance effect element that is different depending upon the magnetization directions of the first electrode and the second electrode.

In the memory array of the present invention, a plurality of magnetoresistance effect elements of the second memory element of the present invention are provided. Like the second memory element of the present invention, the memory array does not need a word line. Therefore, it is possible to realize a memory element that has a simple and small-sized configuration in which the cell area is small, the space for installing the memory is small and the recording density is high.

The method for manufacturing an electronic device of the present invention includes forming a first electrode and a second electrode on a substrate with a gap L therebetween; forming a support that includes at least one selected from a nano-tube and a nano-wire and that bridges a gap between the first electrode and the second electrode seen from the direction perpendicular to the bottom surfaces of the first electrode and the second electrode; and forming a metal conductor portion that bridges a gap between the first electrode and the second electrode seen from the direction perpendicular to the bottom surface by a method of depositing a metal conductor thin film on the support, on the first electrode and the second electrode. The gap L is not more than the mean free path Λ of electron in the metal conductor portion at the operation temperature of the electronic device.

Therefore, it is possible to provide a metal conductor portion having a bridge length L that is not more than the mean free path Λ of electron on the support including at least one selected from the group consisting of the nano-tube and the nano-wire.

In the metal conductor portion having the length L of not more than the mean free path Λ of electron, a phenomenon occurs called a quantum conductance in which the conductivity (conductance) changes stepwise with respect to the cross sectional area of the metal conductor portion is observed.

Since the metal conductor portion of the present invention is formed of metal, unlike the carbon nano-tube described in the non-patent document 4 that is not capable of controlling the conductivity, it has stable conductivity. Furthermore, the contact resistance between the first electrode and the second electrode is extremely reduced. Therefore, the electric property becomes stable.

Therefore, by controlling the cross-sectional area of the metal conductor portion by using the quantum conductance, it is possible to obtain an electronic device capable of avoiding the variation the conductivity occurred when the conductivity with respect to the cross-sectional area is changed linearly.

The method for manufacturing the magnetoresistance effect element of the present invention includes forming a first electrode and a second electrode comprising a magnetic substance on a substrate with a gap L therebetween; forming a support that comprises at least one selected from the group consisting of a nano-tube and a nano-wire and that bridges a gap between the first electrode and the second electrode seen from the direction perpendicular to the bottom surfaces of the first electrode and the second electrode; and forming a metal conductor portion that bridges a gap to the first electrode and the second electrode seen from the direction perpendicular to the bottom surfaces of the first electrode and the second electrode by a method of depositing a metal conductor thin film on the support, on the first electrode and the second electrode. The gap L is not more than a value that is the larger of the value of the length of electron spin diffusion in the metal conductor portion at the operation temperature of the magnetoresistance effect element and the value of mean free path Λ of electron in the metal conductor portion at the operation temperature of the magnetoresistance effect element. The cross-sectional area S1 of the first electrode, the cross-sectional area S2 of the second electrode and the cross-sectional area S3 of the metal conductor portion satisfy the following relationship: S3<S1 and S3<S2.

Therefore, the metal conductor portion having a bridge length L that is the larger of the value of the length of electron spin diffusion and the value of mean free path Λ of electron is formed on the support having at least one selected from the group consisting of the nano-tube and the nano-wire.

In the metal conductor portion having such a bridge length L, a phenomenon occurs called ballistic conduction in which electron passes through the metal conductor portion without being scattered appears.

Since the metal conductor portion of the present invention is formed of metal, it has a stable conductivity unlike a carbon nano-tube described in the non-patent document 3 that is not capable of controlling the conductivity. Furthermore, the contact resistance to the first electrode and the second electrode becomes extremely small. Thus, the electric property becomes stable.

Therefore, to control the magnetization directions of the first and second electrode, it is possible to manufacture magnetoresistance effect elements having an extremely high MR ratio owing to the ballistic conduction.

According to the present invention, it is possible to provide an electronic device having a fine shape controlled on the order of nanometers, a magnetoresistance effect element; a magnetic head, a recording/reproducing apparatus, a memory element and a memory array using the magnetoresistance effect element; a method for manufacturing the electronic device; and a method for manufacturing the magnetoresistance effect element.

DESCRIPTION OF THE PREFERRED EMBODIMENTS

Embodiment 1

Figure 1A:
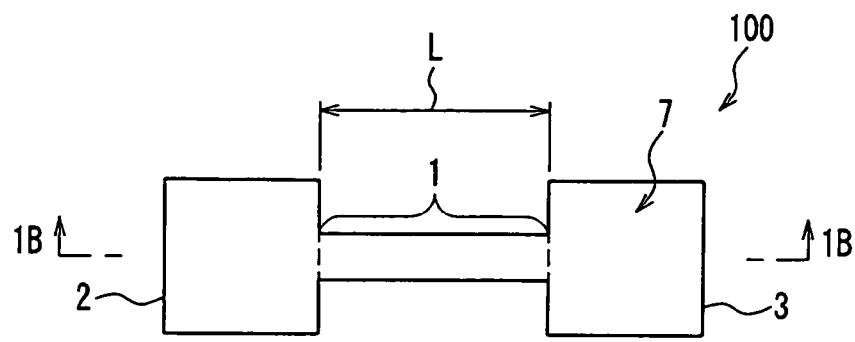
FIG. 1A is a plan view showing an electronic device according to Embodiment 1.
Figure 1B:
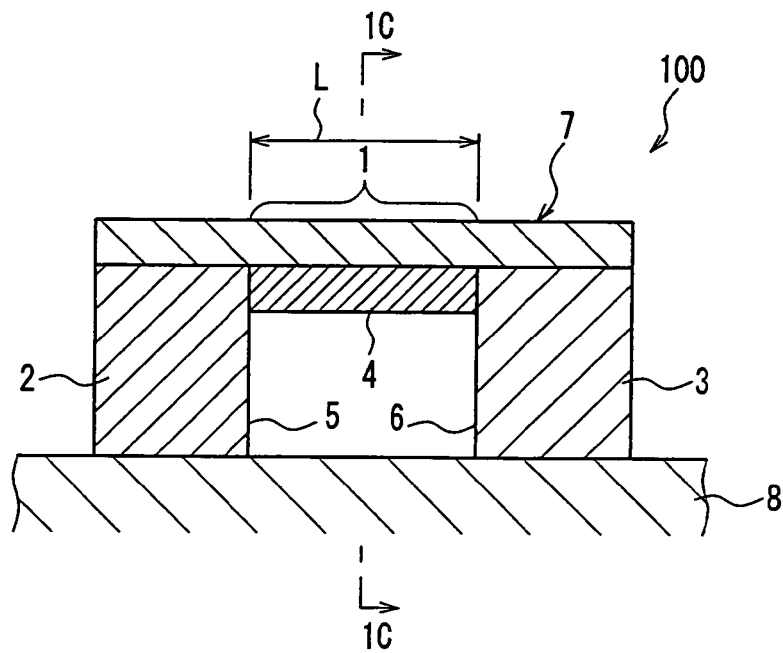
FIG. 1B is a cross-sectional view taken along a line 1B-1B of FIG. 1A.
Figure 1C:
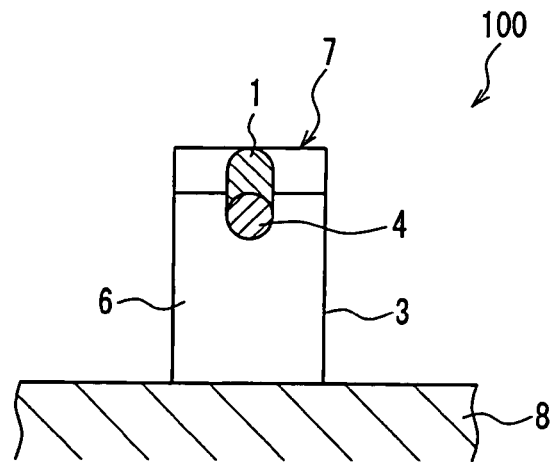
FIG. 1C is a cross-sectional view taken along a line 1C-1C of FIG. 1B.

FIG. 1A is a plan view showing an electronic device 100 according to Embodiment 1; FIG. 1B is a cross-sectional view taken along a line 1B-1B in FIG. 1A; and FIG. 1C is a cross-sectional view taken along a line 1C-1C in FIG. 1B.

The electronic device 100 has rectangular parallelepiped shaped electrodes 2 and 3 formed on a substrate 8. The electrodes 2 and 3 have opposing surfaces 5 and 6 that are opposed to each other, respectively. Materials for the electrodes 2 and 3 are desirably metal or alloy.

The electronic device 100 is provided with a cylindrical support 4 including a carbon nano-tube for bridging the opposing surface 5 of the electrode 2 and the opposing surface 6 of the electrode 3. The carbon nano-tube may be a single layer carbon nano-tube (SWCNT) or may be a multiple layer carbon nano-tube (MWCNT).

The electronic device 100 has a metal conductor thin film 7 that is electrically connected to the electrodes 2 and 3. The metal conductor thin film 7 includes a metal conductor portion 1. When seen from the direction perpendicular to the bottom surfaces of the electrodes 2 and 3, the metal conductor portion 1 bridges a gap between the electrodes 2 and 3 along the support 4. The bridge length L of the metal conductor portion 1 is not more than a mean free path $\Lambda$ of electrons in the metal conductor portion 1 at the operation temperature of the electronic device 100.

The value of the mean free path $\Lambda$ of electrons in the metal conductor portion 1 is different depending upon the operation temperature of the electronic device 100 and the materials of the metal conductor portion 1 that is actually used for the electronic device. When the material is pure Au, Ag and Cu, the value of the mean free path $\Lambda$ of electrons is 100 nm or more. However, when the material is pure Fe, Co, Ni, and the like, the value is on the order of about 10 nm. When the material of the metal conductor portion 1 includes impurities, the value of the mean free path $\Lambda$ of electrons in the metal conductor portion 1 is shorter than that of the mean free path for pure materials. Therefore, the bridge length L of the metal conductor portion 1 is in the range from, for example, 1 nm to 1000 nm in accordance with the chemical composition of the metal conductor portion 1.

It is preferable that the operation temperature of the electronic device 100 is 4.2 K or more and 523 K or less. Furthermore, from the viewpoint that a coolant for the electronic device 100 can be liquid $N_2$ instead of liquid He and that the manufacturing cost and running cost can be reduced, the operation temperature is preferably 77 K or more and 523 K or less. Furthermore, when an apparatus combining the electronic device 100 according to this Embodiment and other electronic devices (for example, semiconductor device, magnetic medium, etc.), if it is necessary to consider the operation temperature of the electronic devices other than the electronic device 100 of the Embodiment, the operation temperature may be 273 K or more and 523 K or less.

Figure 1D:
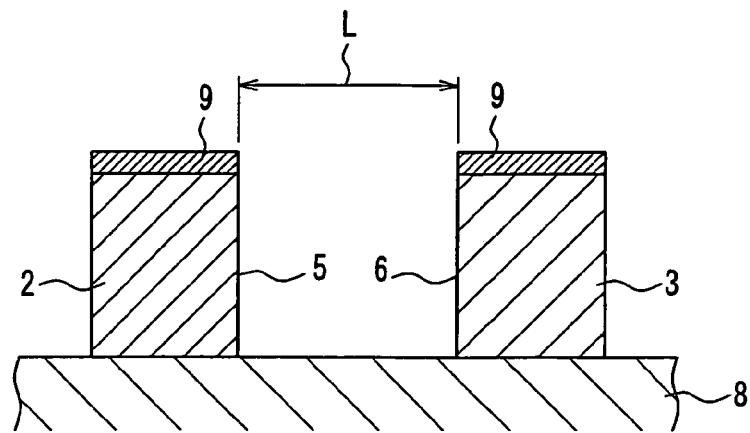
FIG. 1D is a cross-sectional view to explain a method for manufacturing the electronic device according to Embodiment 1.
Figure 1E:
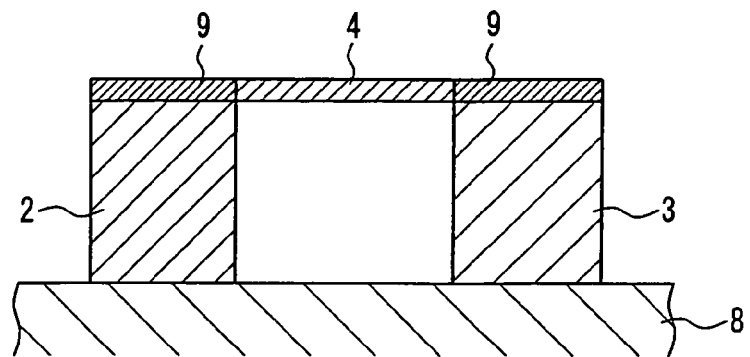
FIG. 1E is a cross-sectional view to explain a method for manufacturing the electronic device according to Embodiment 1.

The method for manufacturing the thus configured electronic device 100 will be described. FIGS. 1D and 1E are cross sectional views to explain the method for manufacturing the electronic device 100. Firstly, the electrodes 2 and 3 are formed on the substrate 8 with a gap having the bridge length L therebetween. Then, a catalyst 9 for promoting a formation reaction of a carbon nano-tube is provided on the electrodes 2 and 3. Next, the carbon nano-tube is allowed to grow from each catalyst 9 by, for example, a chemical vapor deposition method so as to bridge between the electrodes 2 and 3, and thus a support 4 is formed.

Thereafter, on the support 4, and on the electrodes 2 and 3, a metal conductor thin film 7 is deposited by, for example, a vapor deposition method, and thereby the metal conductive portion 1 is formed along the support 4 so as to complete an electronic device 100 shown in FIGS. 1A to 1C.

When the formation of the metal conductor thin film 7 is completed, a junction interface between the catalyst 9 and a metal conductor thin film 7 and a junction interface between the catalyst 9 and the electrodes 2 and 3 become unclear, and thus the catalyst 9 is integrated with the metal conductor thin film 7 or the electrodes 2 and 3.

Thus, the electronic device 100 provided with a metal conductor portion 1 having not more than the bridge length L of the mean free path $\Lambda$ of electron can be manufactured. In this electronic device 100, the metal conductor portion 1 is responsible for electrical conduction between the electrodes 2 and 3. This metal conductor portion 1 is formed of metal. Therefore, unlike the carbon nano-tube of non-patent document 4 that is not capable of controlling the conductivity, the metal conductor portion 1 has a stable conductivity. Furthermore, since the metal conductor thin film 7 including a metal conductor portion 1 is formed of metal, unlike the carbon nano-tube of non-patent document 4, contact resistance between the electrodes 2 and 3 becomes extremely small. Therefore, the electric property is stable, and a problem of a large contact resistance generated between the carbon nano-tube and the electrodes can be solved.

Figure 2A:
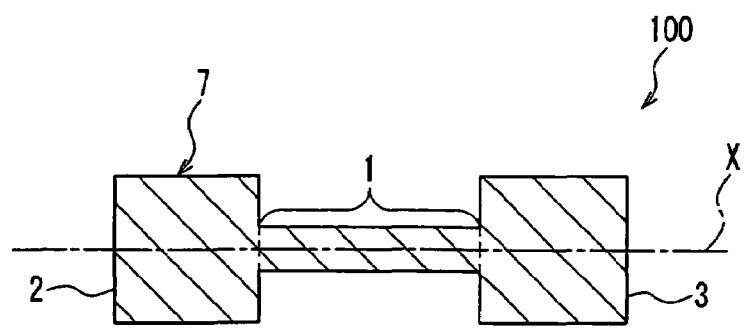
FIG. 2A is a cross-sectional view showing an electronic device to explain a method for measuring the bridge length L of a metal conductor portion according to Embodiment 1.
Figure 2B:
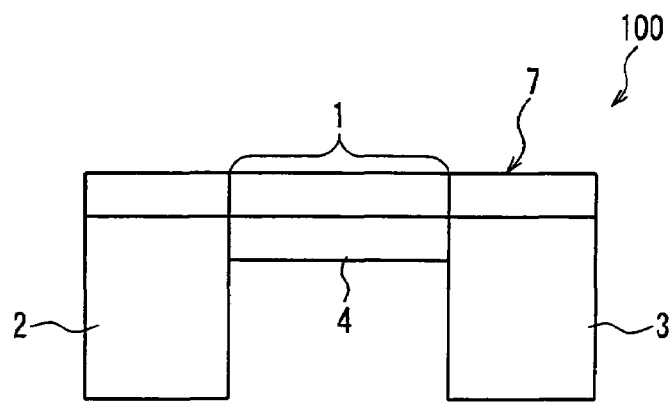
FIG. 2B is a front view to explain a method for measuring the bridge length L according to Embodiment 1.
Figure 2C:
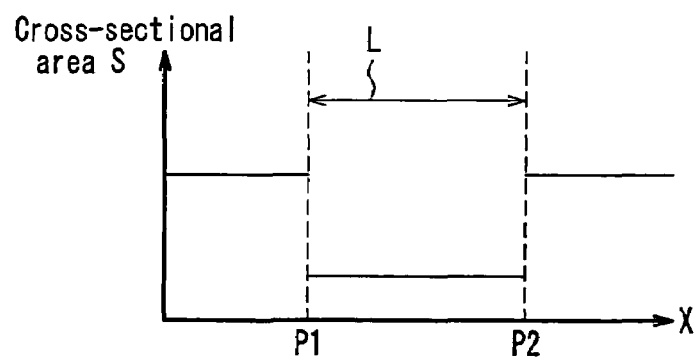
FIG. 2C is a graph for measuring the bridge length L according to Embodiment 1.

Hereinafter, a method for specifically measuring the bridge length L of the metal conductor portion 1 will be described. FIG. 2A is a cross-sectional view showing an electronic device 100 to explain a method for measuring the bridge length L of the metal conductor portion; FIG. 2B is a front view to explain a method for measuring the bridge length L; and FIG. 2C is a graph for measuring a bridge length L. As mentioned above, the phrase "bridge length L of a metal conductor portion" denotes a length along the central axis from a point P1 in which a cross-sectional area along the central axis of the electronic device rapidly is decreased to a point P2 in which a cross-sectional area of the electronic device rapidly is increased.

Firstly, a plurality of electronic devices 100 of the same standard that are manufactured under the same conditions and have the same shape and size are prepared. It can be confirmed whether or not the shape and size of the metal conductor portions 1 of the plurality of electronic devices 100 are the same by an analysis technology such as photography by using TEM (transmission electron microscope).

Then, by using one of the plurality of electronic devices 100, the electronic device 100 is cut by using a STM (Scanning Tunneling Microscope) or a three-dimensional TEM so that a cross section simultaneously containing a metal conductor portion 1 and a metal conductor thin film 7 on the electrodes 2 and 3 can be obtained. FIG. 2A shows one example of the cross sectional shape obtained by this cutting.

Then, based on the obtained cross section, a central axis X of the metal conductor portion 1 is determined. The central axis X is determined in accordance with the cross sectional shape of the metal conductor portion 1. In the example shown in FIG. 2A, a cross sectional shape of the metal conductor portion 1 is rectangular, and the central axis X is a straight line connecting the middle point of the side of the rectangular at the side of the electrode 2 and the middle point of the side at the side of the electrode 3.

Next, by using at least another of a plurality of electronic devices 100, a cross sectional area S of the electronic device 100 along the cross section perpendicular to the central axis X is determined along the central axis X. For example, along the cross section perpendicular to the central axis X, the electronic device 100 is cut by using, for example SIM. Then, the shape is analyzed by photomicrography such as STM, three dimensional TEM, and the like, or by analyzing technology of image data, etc., the cross sectional area S of the cross section obtained by cutting. Thus, data of the cross sectional area S is determined along the central axis X and forms a graph shown in FIG. 2C in which a central axis X is shown in a lateral axis and a cross sectional area S is shown in a longitudinal axis.

Then, in the formed graph, a point P1 in which a cross sectional area S rapidly is decreased along a central axis X and a point P2 in which a cross sectional area S rapidly is increased are determined. From the point P1, the sectional area of electrode 2 is not included in sectional area S, resulting in that sectional area S decreases rapidly at a point P1. From the point P2, the sectional area of electrode 3 is included in sectional area S, resulting in that sectional area S increases rapidly at a point P2. For example, from the graph shown in FIG. 2C, a point P1 in which the cross sectional area S is decreased discontinuously and a point P2 in which the cross sectional area S is increased discontinuously.

Then, the length between the point P1 and the point P2 along the central axis X is defined as a bridge length of the metal conductor portion 1.

Figure 2D:
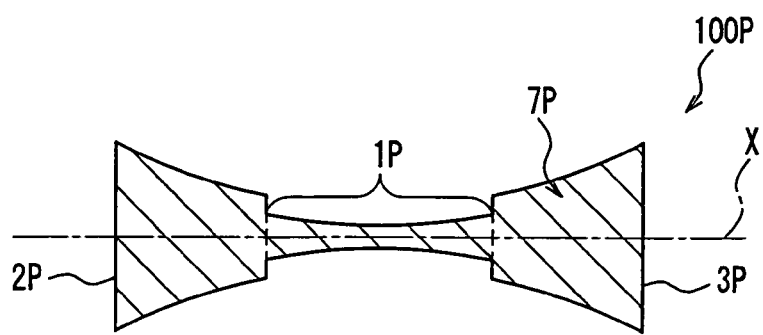
FIG. 2D is a cross-sectional view showing an electronic device to explain a method for measuring the bridge length L of a metal conductor portion according to Embodiment 1.
Figure 2E:
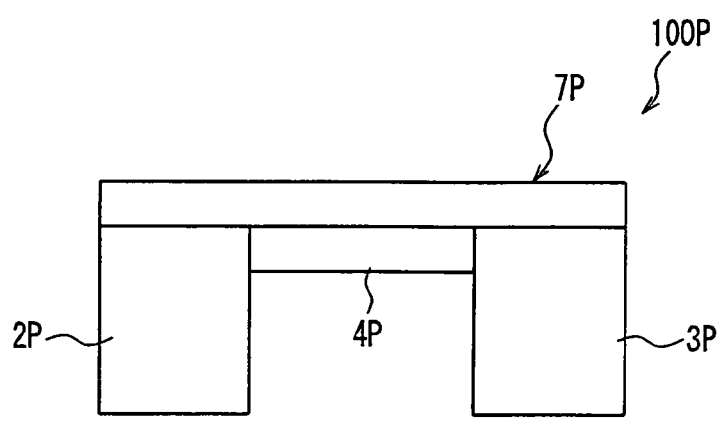
FIG. 2E is a front view showing another electronic device to explain a method for measuring the bridge length L according to Embodiment 1.
Figure 2F:
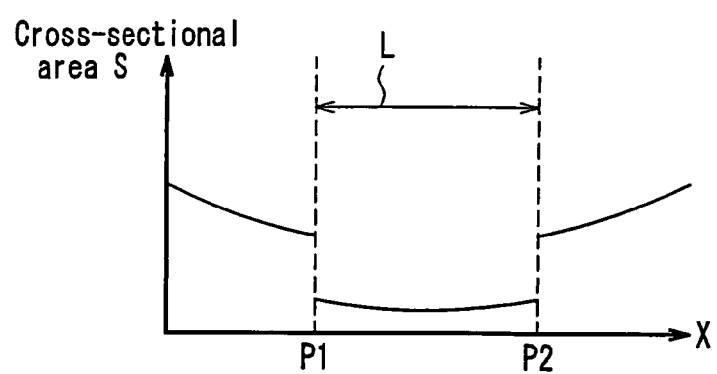
FIG. 2F is another graph for measuring the bridge length L according to Embodiment 1.

FIG. 2D is a cross-sectional view showing another electronic device 100P to explain a method for measuring a bridge length L of a metal conductor portion; FIG. 2E is a front view thereof, and FIG. 2F is another graph for measuring a bridge length L. As shown in FIG. 2D, a contour of the electrodes 2P and 3P of the electronic device 100P, a metal conductor thin film 7P and a metal conductor portion 1P includes a curved line unlike the example shown in FIGS. 2A to 2C.

Similar to the example shown in FIGS. 2A to 2C, a central axis X is determined; a cross sectional area S is determined along the central axis X; and a graph of a cross sectional area S shown in FIG. 2F is formed. Then, a point P1 in which a cross sectional area S is decreased rapidly along the central axis X and a point P2 in which a cross sectional area S is increased rapidly are determined. The length between the point P1 and the point P2 along the central axis X is defined as a bridge length L of the metal conductor portion 1. A contour of the cross section of the metal conductor portion 1P and the metal conductor thin film 7P includes a curved line, however, since a point P1 in which a cross sectional area S is decreased rapidly and a point P2 in which a cross sectional area S is increased rapidly appear in a graph similar to the example shown in FIG. 2A to 2C, the bridge length L between the point P1 and the point P2 along the central axis X can be measured.

Figure 2G:
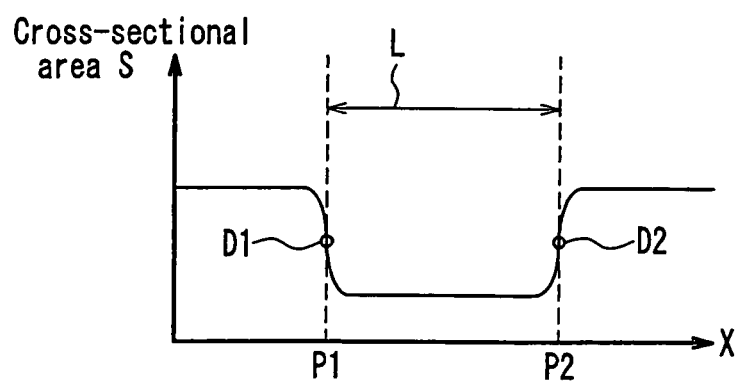
FIG. 2G is a further graph for measuring the bridge length L according to Embodiment 1.
Figure 2H:
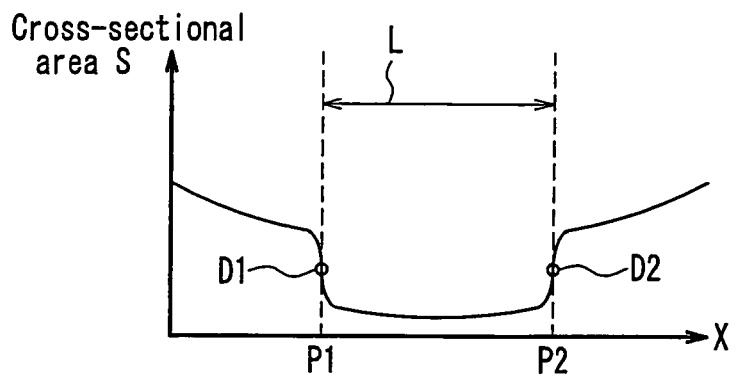
FIG. 2H is a yet further graph for measuring the bridge length L according to Embodiment 1.

Note here that as shown in FIGS. 2G and 2H, in the formed graph, in accordance with the shape of the metal conductor portion and the shape of the electrodes, a dear discontinuous point does not appear and the cross sectional area S is likely to change continuously. In this case, a point corresponding to an inflection point D1 in a region in which the cross sectional area S is decreased rapidly is defined as a point P1 and the point corresponding to an inflection point D2 in a region in which the cross sectional area S is increased rapidly is defined as a point P2, and then the bridge length L of the metal conductor portion 1 is measured.

FIGS. 2I to 2U are views showing various cross sectional shapes and central axes X of the metal conductor portion 1. The cross section of the metal conductor portion 1 can be formed in various shapes as shown in FIGS. 2I to 2U. The central axis X is defined in accordance with the cross sectional shape of the metal conductor portion as mentioned above. In FIGS. 2I to 2U, a left side of the paper shows the side of the electrode 2 and a right side of the paper shows the side of the electrode 3.

The metal conductor portion has a shape having two bottom surfaces and a cylindrical side surface formed between these two bottom surfaces. Then, the cross sectional shape of the metal conductor portion in this Embodiment can satisfy any of the following conditions [a] to [g].

That is to say, in the above-mentioned cross sectional shape of the metal conductor portion, lines (two lines in the longitudinal direction) showing the periphery of the metal conductor portion is any of the following [a] to [g]. [a]: straight lines having a constant width (a length in the shorter direction);

[b]: straight lines or curved lines having a width (a length in the shorter direction) that is monotonically decreased from the side of the electrode 2 to the direction of the electrode 3;

[c]: straight lines or curved lines having a width (a length in the shorter direction) that is monotonously decreased from the side of the electrode 3 to the direction of the electrode 2;

[d]: a combination of the above-mentioned [b] and [c];

[e]: a combination of the above-mentioned [a] and [b];
[f]: a combination of the above-mentioned [a] and [c]; and
[g]: a combination of the above-mentioned [a], [b] and [c].

FIGS. 2I to 2U show examples of cross sectional shapes showing only the metal conductor portion 1 satisfying the above-mentioned conditions [a] to [g]. The cross sectional shape of the metal conductor portion 1 shown in FIG. 2I corresponds to the cross sectional shape of the metal conductor portion 1 mentioned with reference to FIGS. 1A to 1C and satisfies the condition [a]. The cross sectional shape shown in FIG. 2J corresponds to the cross sectional shape of the metal conductor portion 1P mentioned with reference to FIGS. 2D and 2E and satisfies the condition [d]. The cross sectional shape shown in FIG. 2K satisfies the condition [g]. The cross sectional shape shown in FIG. 2L satisfies the condition [d].

Figure 2I:
FIGS. 2I to 2U are views showing various cross sectional shapes and central axes of the metal conductor portion of the electronic device according to Embodiment 1.
Figure 2J:
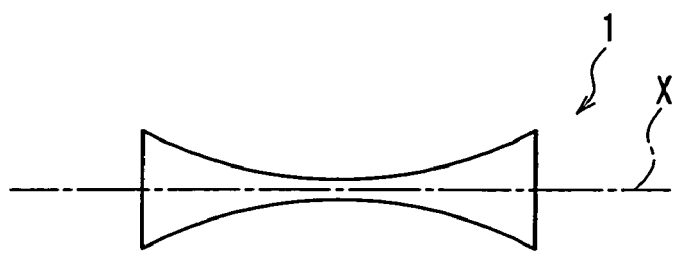
Figure 2K:
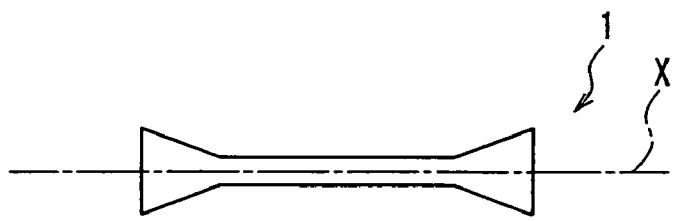
Figure 2L:
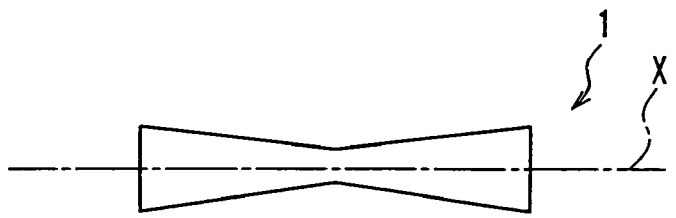
Figure 2M:
Figure 2N:
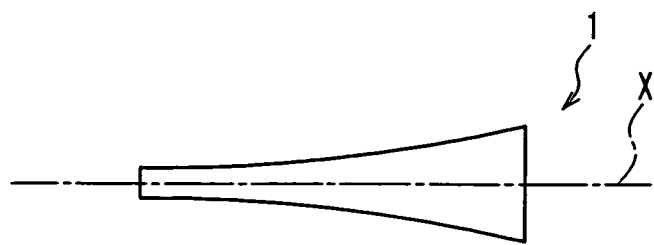
Figure 2O:
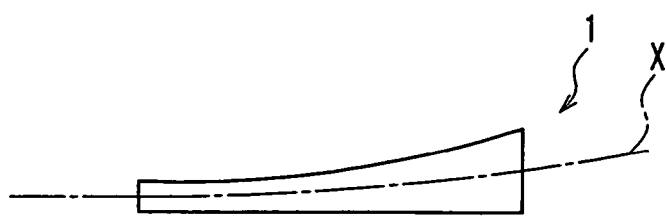
Figure 2P:
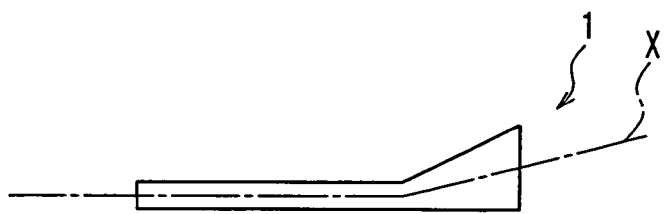
Figure 2Q:
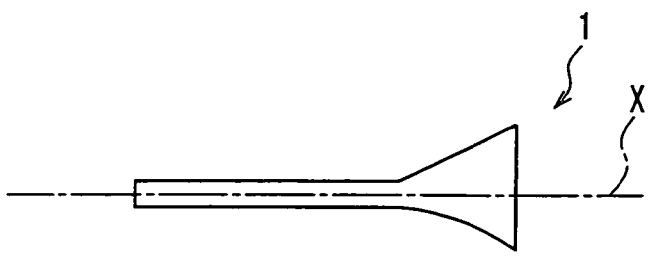
Figure 2R:
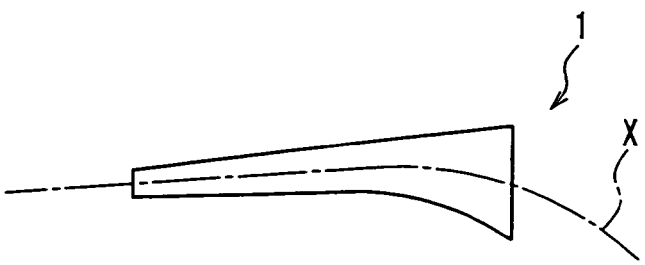
Figure 2S:
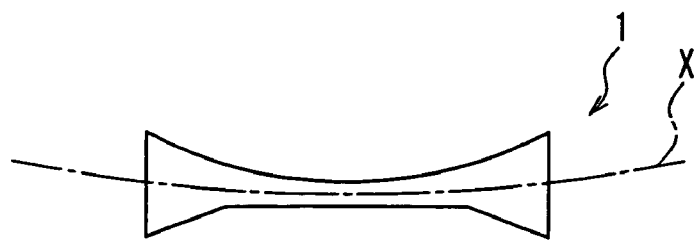
Figure 2T:
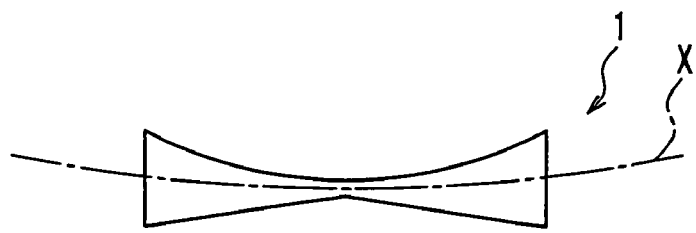
Figure 2U:
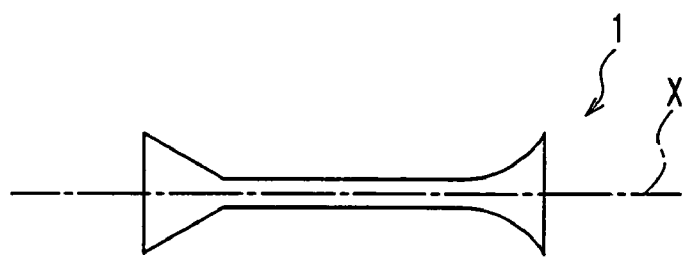

FIG. 2M satisfies the condition [f]. FIGS. 2N and 2O satisfy the condition [c]. FIGS. 2P and 2Q satisfy the condition [f]. FIG. 2R satisfies the condition [c]. FIGS. 2S and 2T satisfy the condition [d]. FIG. 2U satisfies the condition [g].

The shape of the bottom surface of the metal conductor portion in the Embodiment is not particularly limited. Furthermore, the shapes and the size of the two bottom surfaces (the surfaces at the side of the electrode 2 and the side of the electrode 3) may be the same as each other or may be different from each other. Furthermore, the side surface formed between the two bottom surfaces may be a flat or curved surface or combination of a flat surface and a curved surface.

Furthermore, from the viewpoint of obtaining a stable performance more reliably, a cylindrical metal conductor portion in the embodiment has a shape satisfying all of the following conditions [h] to [l] simultaneously.

[h] two bottom surfaces have the same shapes;
[i] two bottom surfaces have the same areas;
[j] two bottom surfaces are in parallel to each other;
[k] a central axis of the metal conductor portion is a straight line; and
[l] two bottom surfaces are symmetric with respect to each other about a plane that is perpendicular to the central axis of the above-mentioned [k] and includes the midpoint of the central axis.

Examples of the cylindrical metal conductor portion having the shape that satisfies the conditions [h] to [1] at the same time may include the metal conductor portions having the cross sectional shapes shown in FIGS. 2I and 2L.

The central axis X of the metal conductor portion 1 is one straight line in general. However, the central axis X of the metal conductor portion 1 having the cross sectional shape shown in FIG. 2P is defined by the combination of two straight lines; and the central axis X of the metal conductor portion 1 having the cross sectional shape shown in FIG. 2R is defined by the combination of a straight line and a curved line. The central axes X of the metal conductor portion 1 having the cross sectional shape shown in FIGS. 2O, 2S and 2T are defined by a curved surface.

Furthermore, at least one of a concave portion and a convex portion may be formed by a processing technique such as STM. However, in this case, it is preferable that the cross sectional shape of the metal conductor portion before the concave portion and the convex portion are formed (or a metal conductor portion provided that the concave portion and convex portion are not formed) has any of the above-mentioned shapes [a] to [g].

The shape of the support 4 is not particularly limited as long as the above-mentioned metal conductor portion 1 can be formed.

In the electronic device 100 of this embodiment, the bridge length L of the metal conductor portion 1 that is responsible for electrical conduction is not more than the mean free path $\Lambda$ of electrons in the metal conductor portion 1 at the operation temperature of the electronic device. Therefore, a phenomenon occurs called a ballistic conduction capable of allowing electrons to pass through the metal conductor portion 1 without being scattered and a phenomenon occurs called a quantum conductance in which the conductivity (conductance) changes stepwise with respect to the cross sectional area of the metal conductor portion 1. In the electronic device of the embodiment, the size of the metal conductor portion is on the order of nanometers because the metal conductor portion is formed on the carbon nano-tube, and the ballistic conduction and the quantum conductance can be observed also at relatively high temperatures.

When the quantum conductance in the metal conductor portion 1 is used, by controlling the cross sectional area of the metal conductor portion 1, electronic devices that is free from variation in the conductivities in mass production, which is generated when the conductivities with respect to the cross sectional area of the metal conductor portion 1 continuously changes.

In FIGS. 1A, a gate portion is provided in the vicinity of the metal conductor portion 1 and the electrodes 2 and 3 formed of a magnetic film are served as a source and a drain. Thereby, a spin transistor can be achieved. Furthermore, if the metal conductor portion 1 and the support 4 are separated from the electrodes 2 and 3, a single electron transistor using the coulomb brocade phenomenon can be achieved.

In the electronic device 100 shown in FIGS. 1A to 1C, if at least the electrodes 2 and 3 are composed of a magnetic substance, by using the ballistic conduction in the metal conductor portion 1, a spin electronics device having a high MR ratio (magnetoresistance effect element) in which the magnetic resistance changes in the magnetization direction of the both electrodes 2 and 3 can be obtained. In this case, the bridge length L of the metal conductor portion 1 is a value that is not more than the larger of the value of the length of electron spin diffusion in the metal conductor portion at the operation temperature of the magnetoresistance effect element and the value of mean free path $\Lambda$ of electron in the metal conductor portion at the operation temperature of the magnetoresistance effect element.

In genera materials, the value of the length of electron spin diffusion is larger than the mean free path $\Lambda$ of electron. For example, in the case of Co, the length of electron spin diffusion is about 50 nm and the mean free path $\Lambda$ of electron is 5 nm. Therefore, the bridge length L of the metal conductor portion 1 generally may be set to the length of electron spin diffusion or less. However, there may be a material such as Ni having a mean free path $\Lambda$ of electron that is larger than a length of electron spin diffusion. When the metal conductor portion 1 is formed of such a material, the bridge length L may be set to not more than a mean free path $\Lambda$ of electron. Note here that when a length of electron spin diffusion and a mean free path $\Lambda$ of electron are equal to each other, the bridge length L may be set to the equal value or less.

When the metal conductor portion 1 and the support 4 are separated from the electrodes 2 and 3, it is possible to realize a spin electronics device using the above-mentioned coulomb brocade phenomenon not only a spin brocade phenomenon in accordance with the spin condition of the separated metal conductor portion 1 and the electrodes 2 and 3.

When the electrodes 2 and 3 are composed of magnetic substances, it is desirable that the catalyst 9 uses metal/alloy particles or film containing at least one atom selected from the group consisting of Fe, Co and Ni. It is thought that these catalysts promote the reaction in which carbon (C) generated by decomposing $CH_4$, etc. grows into a carbon nano-tube when the carbon nano-tube is formed by a CVD method, etc.

After the electronic device is formed in the above-mentioned method, the support 4 made of carbon nano-tube may be removed. The support 4 may be selectively removed by oxygen asher. Furthermore, the support 4 may be removed by irradiating the support 4 with laser. However, from the viewpoint of the strength, the support 4 may remain. Furthermore, after the electronic device is formed in the above-mentioned method, the substrate 8 may be removed. In particular, when CNT is used for the substrate 8, since the CNT of the substrate 8 shows three kinds of properties of a conductor, a semiconductor and an insulator, by removing the substrate 8 composed of CNT, the electric property of the electronic device becomes more stable.

Figure 3A:
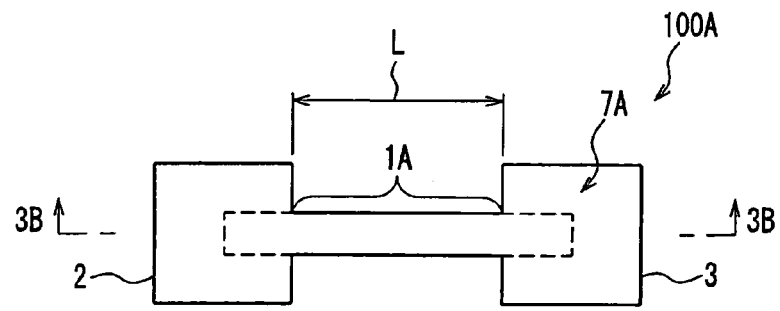
FIG. 3A is a plan view showing a further electronic device according to Embodiment 1.
Figure 3B:
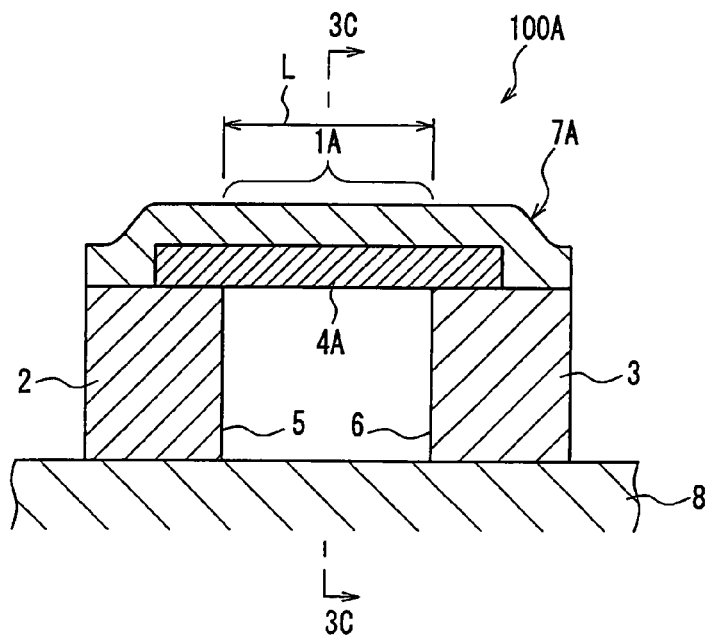
FIG. 3B is a cross-sectional view taken along a line 3B-3B of FIG. 3A.
Figure 3C:
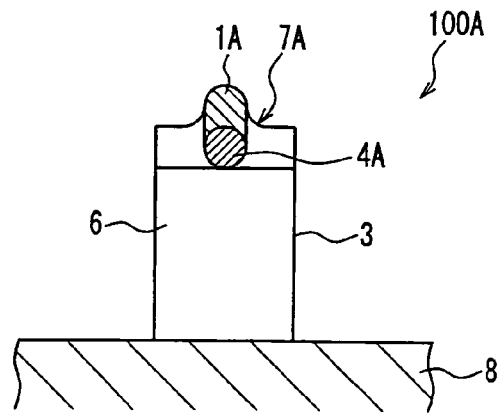
FIG. 3C is a cross-sectional view taken along a line 3C-3C of FIG. 3B.

FIG. 3A is a plan view showing a further electronic device 100A according to Embodiment 1; FIG. 3B is a cross-sectional view taken along a line 3B-3B of FIG. 3A; and FIG. 3C is a cross-sectional view taken along a line 3C-3C of FIG. 3B. The same components mentioned with reference to FIGS. 1A to 1E are denoted with the same reference numerals, and the repeated description may be omitted.

The support may be formed on the surface of the both electrodes. The support 4A of the electronic device 100A is formed on the surface of the electrode 2 and on the surface of the electrode 3. When seen from the direction perpendicular to the bottom surface of the electrodes 2 and 3, the support 4A bridges a gap between the electrodes 2 and 3. The metal conductor thin film 7A of the electronic device 100A is formed on the electrodes 2 and 3. When seen from the direction perpendicular to the bottom surface of the electrodes 2 and 3, the metal conductor portion 7A includes a metal conductor portion 1A that bridges a gap between the electrodes 2 and 3 along the support 4A. The bridge length L of the metal conductor portion 1A is not longer than the mean free path Λ of electron in the metal conductor portion 1A at the operation temperature of the electronic device 100A. The thus configured electronic device 100A has the same effect as that of the above-mentioned electronic device 100.

Figure 3D:
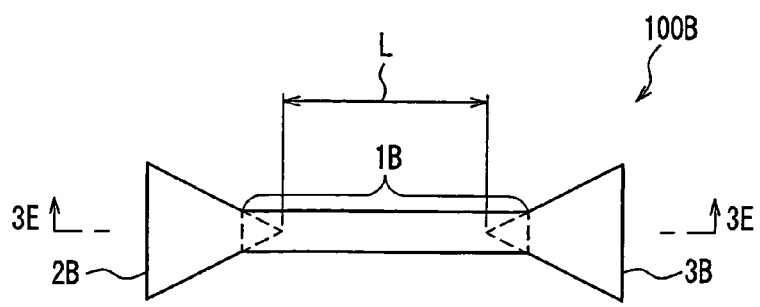
FIG. 3D is a plan view showing a further electronic device according to Embodiment 1.
Figure 3E:
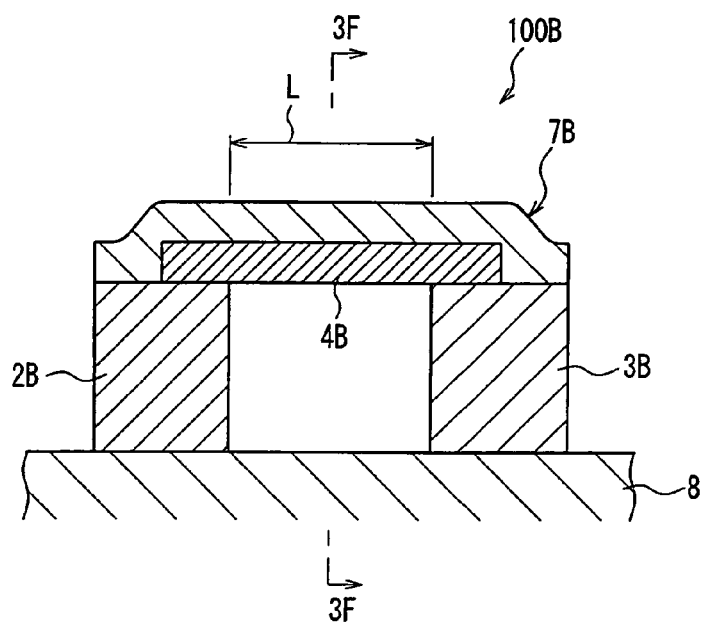
FIG. 3E is a front view showing a further electronic device according to Embodiment 1.
Figure 3F:
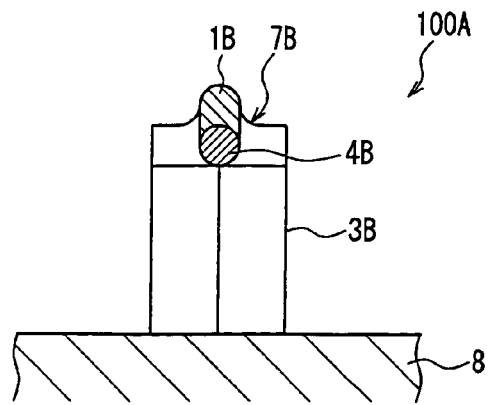
FIG. 3F is a cross-sectional view taken along a line 3F-3F of FIG. 3E.

FIG. 3D is a plan view showing a further electronic device 100B according to Embodiment 1; FIG. 3E is a cross-sectional view taken along a line 3E-3E of FIG. 3D; and FIG. 3F is a cross-sectional view taken along a line 3F-3F of FIG. 3E. The same components mentioned with reference to FIGS. 1A to 1E are denoted with the same reference numerals, and the repeated description may be omitted.

The electrode may have a triangular prism shape. The electronic device 100B is provided with triangular prismatic electrodes 2B and 3B. The electrodes 2B and 3B are formed at the positions respectively so that apex of the surfaces thereof are opposed to each other when seen from the direction perpendicular to the bottom surface. The support 4B of the electronic device 100B bridges a gap between the triangular prismatic shaped electrodes 2B and 3B. The metal conductor thin film 7B of the electronic device 100B includes a metal conductor potion 1B that bridges a gap between the electrodes 2B and 3B along the support 4B seen from the direction perpendicular to the bottom surfaces. The length of the bridge of the metal conductor portion 1B is not more than the mean free path of electron in the metal conductor portion 1B. The thus configured electronic device 100B also has the same effect as that of the above-mentioned electronic device 100.

Figure 3G:
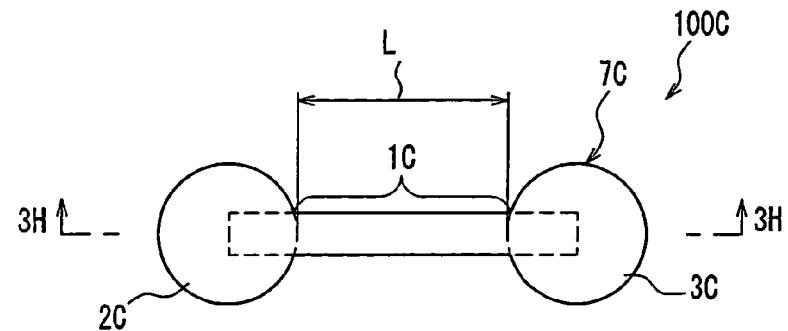
FIG. 3G is a plan view showing a yet further electronic device according to Embodiment 1.
Figure 3H:
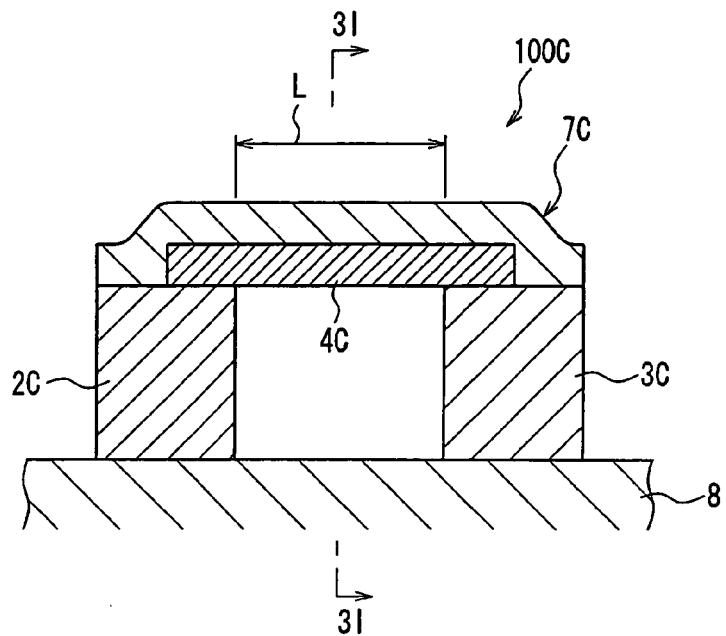
FIG. 3H is a front view showing a yet further electronic device according to Embodiment 1.
Figure 3I:
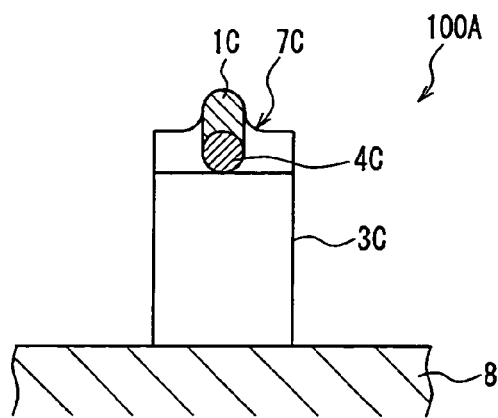
FIG. 3I is a cross-sectional view taken along a line 3I-3I of FIG. 3H.

FIG. 3G is a plan view showing a yet further electronic device 100C according to Embodiment 1; FIG. 3H is a cross-sectional view taken along a line 3H-3H of FIG. 3G; and FIG. 3I is a cross-sectional view taken along a line 3I-3I of FIG. 3H. The electrode may have a cylindrical shape. The electronic device 100C has cylindrical shaped electrodes 2C and 3C. The support 4C of the electronic device 100C bridges a gap between the electrodes 2C and 3C. The electronic device 100C has the metal conductor thin film 7C including the metal conductor portion 1C. The bridge length L of the metal conductor portion 1C is not more than the mean free path Λ of electron in the metal conductor portion 1C. The thus configured electronic device 100C also has the same effect as that of the above-mentioned electronic device 100.

Figure 3J:
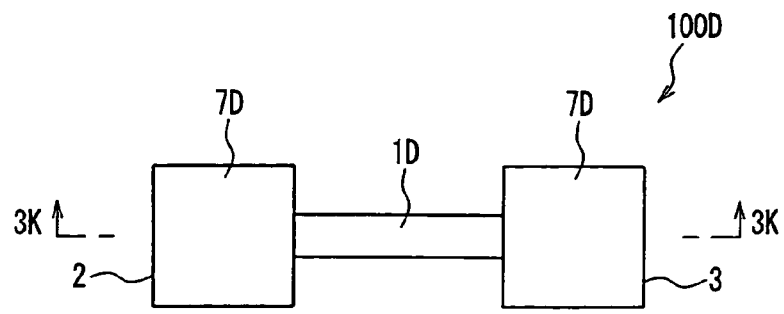
FIG. 3J is a plan view showing a further electronic device according to Embodiment 1.
Figure 3K:
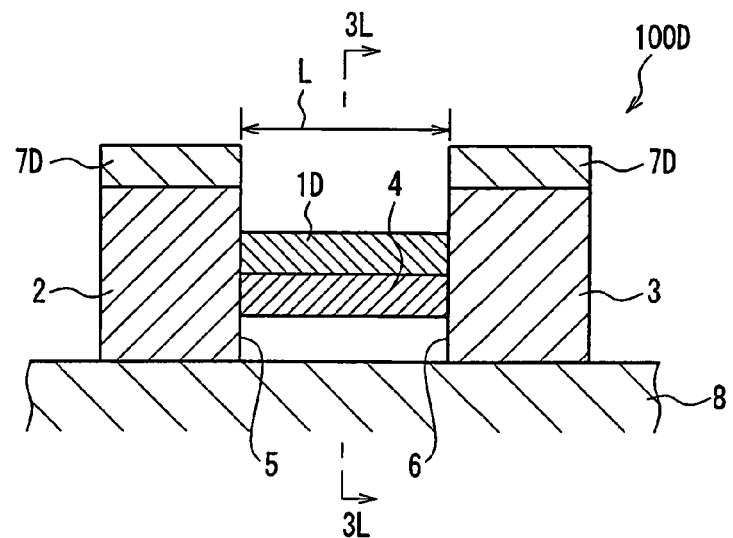
FIG. 3K is a cross-sectional view taken along a line 3K-3K of FIG. 3J.
Figure 3L:
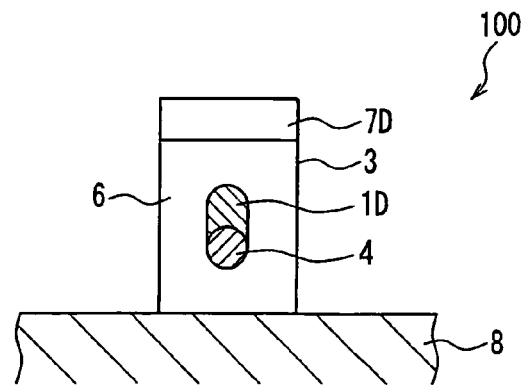
FIG. 3L is a cross-sectional view taken along a line 3L-3L of FIG. 3K

FIG. 3J is a plan view showing a further electronic device 100D according to Embodiment 1; FIG. 3K is a cross-sectional view taken along a line 3K-3K of FIG. 3J; and FIG. 3L is a cross-sectional view taken along a line 3L-3L of FIG. 3K The metal conductor for directly bridging the opposing surfaces of both electrodes may be formed. The electronic device 100D includes a cylindrical support 4 made of carbon nano-tube that bridges between the opposing surface 5 of the electrode 2 and the opposing surface 6 of the electrode 3; and the metal conductor 1D that directly bridges between the opposing surface 5 of the electrode 2 and the opposing surface 6 of the electrode 3 along the support 4. On the surfaces of the electrodes 2 and 3, a metal conductor thin film 7D is formed separately from the metal conductor 1D. The bridge length L of the metal conductor 1D is not more than the mean free path Λ of electron in the metal conductor portion 1D. The thus configured electronic device 100D has the same effect as that of the above-mentioned electronic device 100.

Embodiment 2

Figure 4A:
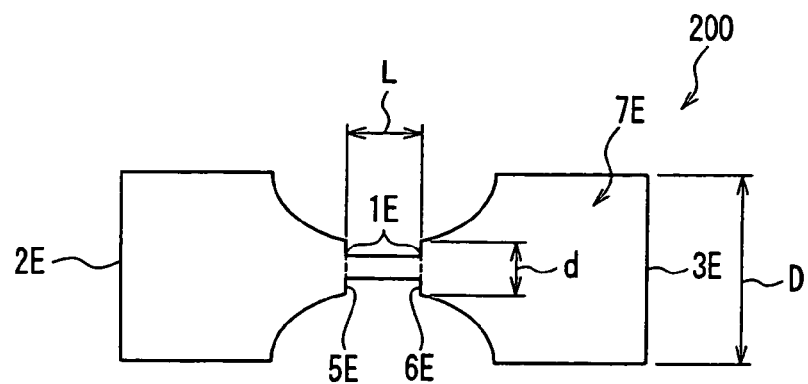
FIG. 4A is a plan view showing a magnetoresistance effect element according to Embodiment 2.
Figure 4B:
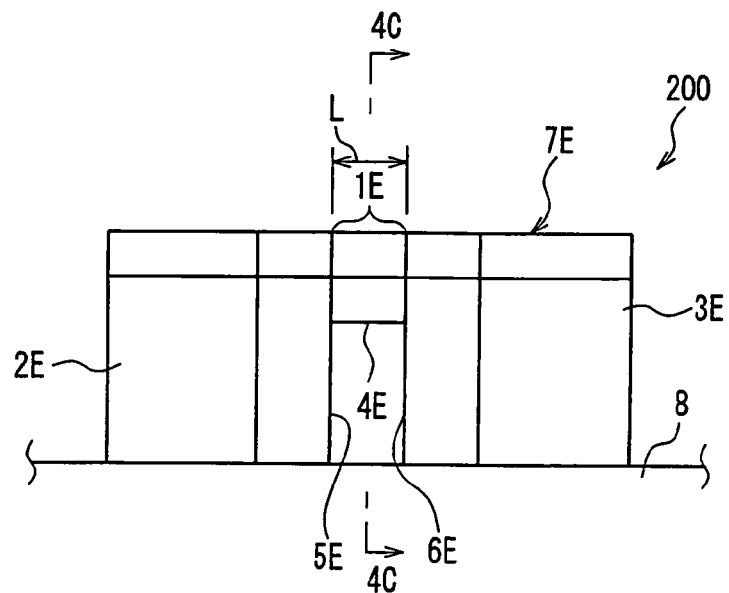
FIG. 4B is a front view showing a magnetoresistance effect element according to Embodiment 2.
Figure 4C:
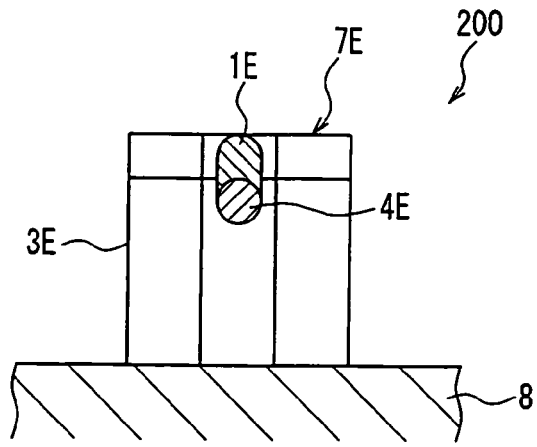
FIG. 4C is a cross-sectional view taken along a line 4C-4C of FIG. 4B.

FIG. 4A is a plan view showing a magnetoresistance effect element 200 according to Embodiment 2; FIG. 4B is a front view thereof, and FIG. 4C is a cross-sectional view taken along a line 4C-4C of FIG. 4B. The same components as those mentioned in Embodiment 1 are denoted with the same reference numerals, and the repeated description may be omitted.

The magnetoresistance effect element 200 includes electrodes 2E and 3E made of a magnetic substance. The electrodes 2E and 3E respectively have the opposing surfaces 5E and 6E opposing each other. The electrodes 2E and 3E include a curved portion having a width D that is reduced to the width d respectively toward the opposing surfaces 5E and 6E.

The magnetoresistance effect element 200 is provided with a cylindrical support 4E made of a carbon nano-tube that bridges the opposing surface 5E of the electrode 2E and the opposing surface 6E of the electrode 3E.

The magnetoresistance effect element 200 has a metal conductor thin film 7E electrically connected to the electrodes 2E and 3E. It is preferable that the metal conductor thin film 7E includes a magnetic substance. The metal conductor thin film 7E includes the metal conductor portion 1E. The metal conductor portion 1E bridges a gap between the electrodes 2E and 3E along the support 4E seen from the direction perpendicular to the bottom surface of the electrodes 2E and 3E. The bridge length L of the metal conductor portion 1E is not more than a value that is the larger of the value of the length of electron spin diffusion in the metal conductor portion 1E at the operation temperature of the magnetoresistance effect element 200 and the value of mean free path Λ of electron in the metal conductor portion 1E at the operation temperature of the magnetoresistance effect element 200.

The cross sectional area S1 of the electrode 2E, the cross sectional area S2 of the electrode 3E and the cross sectional area S3 of the metal conductor portion 1E satisfy the relationship:

$$S3<S1 \text{ and } S3<S2.$$

In this way, when the cross sectional area S3 of the metal conductor portion is set to be smaller than the cross sectional areas Si and S2 of the electrodes, when the metal conductor portion 1E is made of a magnetic substance, a magnetic domain wall can be pinned in the metal conductor portion 1E easily. Furthermore, also in the case where the metal conductor portion 1E is not made of a magnetic substance, when the cross sectional area S3 of the metal conductor portion is set to be smaller than the cross sectional areas S1 and S2 of the electrode, a main portion of the resistance of the magnetic resistance element is allowed to be carried out by the metal conductor portion 1E. The cross-sectional areas S1, S2 and S3 are cross-sectional areas along the cross section that is perpendicular to the central axis of the metal conductor portion used for determining the bridge length L mentioned in Embodiment 1.

The method for manufacturing the thus configured magnetoresistance effect element 200 will be described. Firstly, electrodes 2E and 3E including a magnetic substance are formed on a substrate 8 with a gap having the bridge length L therebetween. Then, a catalyst for promoting a formation reaction of a carbon nano-tube is provided on the electrodes 2E and 3E. Next, the carbon nano-tube is allowed to grow from each catalyst 9 by, for example, a chemical vapor deposition (CVD) method so as to bridge between the electrodes 2E and 3E, and thus a support 4E is formed. Thereafter, on the support 4E and on electrodes 2E and 3E, a metal conductor thin film 7E is deposited by, for example, a vapor deposition method, and thereby forms the metal conductive portion 1E so as to complete an magnetoresistance effect element 200.

By depositing the metal conductor thin film 7E on the support 4E of the carbon nano-tube, it is possible to form the metal conductor portion 1E having the bridge length L that is not more than a value that is the larger of the value of the length of electron spin diffusion and the value of mean free path Λ of electron.

This metal conductor portion 1E is responsible for electrical conduction between the electrodes 2E and 3E. This metal conductor portion 1E is made of metal. Therefore, unlike the carbon nano-tube of non-patent document 1 that is not capable of controlling the conductivity, the metal conductor portion 1E has a stable conductivity. Furthermore, since the metal conductor thin film 7 including a metal conductor portion 1E is formed of metal, unlike the carbon nano-tube of non-patent document 4, contact resistance between the electrodes 2E and 3E becomes extremely small. Therefore, the electric property is stable, and a problem of a large contact resistance generated between the carbon nano-tube and the electrodes can be solved.

In the metal conductor portion 1E having the bridge length L that is not more than the larger of the length of electron spin diffusion and the mean free path Λ of electrons, a phenomenon called a ballistic conduction capable of allowing electrons to pass through the metal conductor portion 1E without being scattered is observed. When the magnetization direction of the electrodes 2E and 3E can be controlled, and a magnetoresistance effect element having an extremely high MR ratio can be obtained owing to the ballistic conduction.

Figure 4D:
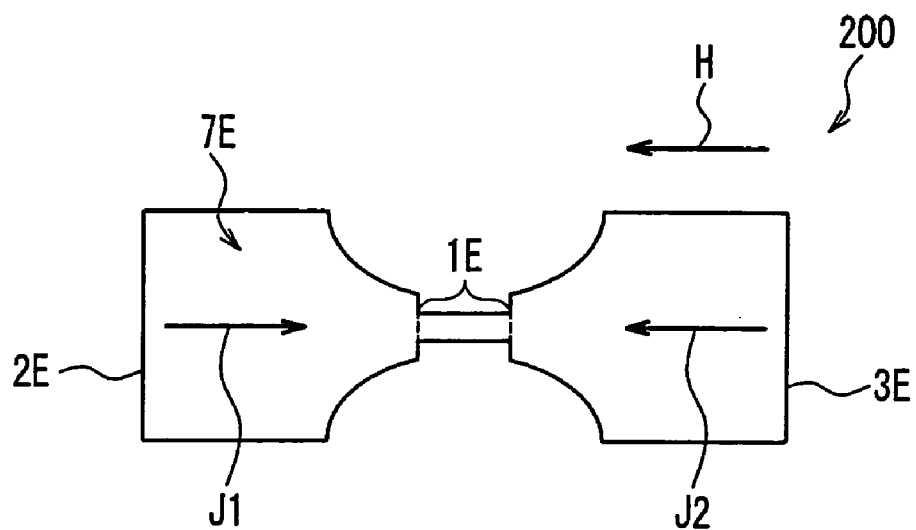
FIG. 4D is a plan view to explain an operation of the magnetoresistance effect element according to Embodiment 2.
Figure 4E:
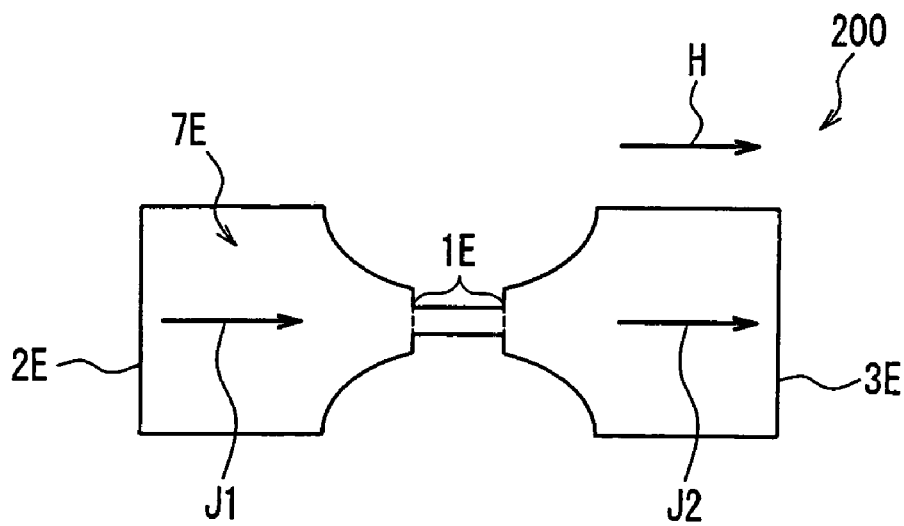
FIG. 4E is a plan view to explain an operation of the magnetoresistance effect element according to Embodiment 2.

FIGS. 4D and 4E are plan views to explain an operation of the magnetoresistance effect element 200 when a magnetic substance is used for the metal conductor portion 1E. As shown in FIG. 4D, when the magnetization direction J2 of the electrode 3E is in anti-parallel to the magnetization direction J1 of the electrode 2E due to the external magnetic field H, since the magnetic domain wall is pined to the metal conductor portion 1E, electrons are scattered by the magnetic domain wall and resistance becomes high. As shown in FIG. 4E, when the magnetization direction J2 of the electrode 3E is in parallel to the magnetization direction J1 of the electrode 2E due to the external magnetic field H, since the magnetic domain wall disappears from the metal conductor portion 1E, scattering of electrons is not carried out by the magnetic domain wall and resistance becomes low.

In the metal conductor portion 1E having the length of a bridge that is not more than the larger of the length of electron spin diffusion and the mean free path Λ of electrons, since a ballistic conduction capable of allowing electrons to pass through the metal conductor portion 1E without being scattered occurs, the difference between the resistance between the electrodes 2E and 3E in an anti-parallel state shown in FIG. 4D and the resistance between the electrodes 2E and 3E in a parallel state in FIG. 4E becomes extremely large. As a result, a magnetoresistance effect element having a MR ratio of 100% or more, that is, a much larger MR ratio than that of a conventional GMR element can be realized.

Note here that when a metal conductor portion 1E is composed of a non-magnetic substance, a magnetic domain wall is not generated on the metal conductor portion 1E. However, similar to a conventional GMR element, when the magnetization direction of the electrodes 2 and 3 are in parallel to each other, scattering of spin is not generated and the resistance becomes low, and when the magnetization direction of the electrodes 2 and 3 are in anti-parallel to each other, scattering of spin is generated and the resistance becomes high. In this case, unlike a conventional GMR element, in the metal conductor portion 1E, the ballistic conduction is generated. Therefore, the MR ratio that is larger than a conventional GMR element can be obtained.

Furthermore, without using a magnetic substance for both electrodes, when the magnetic substance is used only for the metal conductor portion 1E, a large MR tatio can be obtained by forming a concave portion in a metal conductor portion 1E so as to trap a magnetic domain wall and to keep the resistance high and then by allowing electric current that shows a certain threshold value or more to flow from one of the electrodes 2E and 3E so as extinguish the magnetic domain wall and to lower the resistance.

It is preferable that magnetic substances used for the electrodes 2E and 3E and the metal conductor portion 1E are composed of a material containing at least one element selected from the group consisting of Fe, Co and Ni or a semi-metal magnetic material having a large spin polarizability.

Note here that when a carbon nano-tube is allowed to grow while applying different voltages to the electrode 2E and 3E respectively, the direction in which the carbon nano-tube is grown can be controlled easily. It is preferable that the catalyst contains at least one element selected from the group consisting of Fe, Co and Ni.

Embodiment 3

Figure 5A:
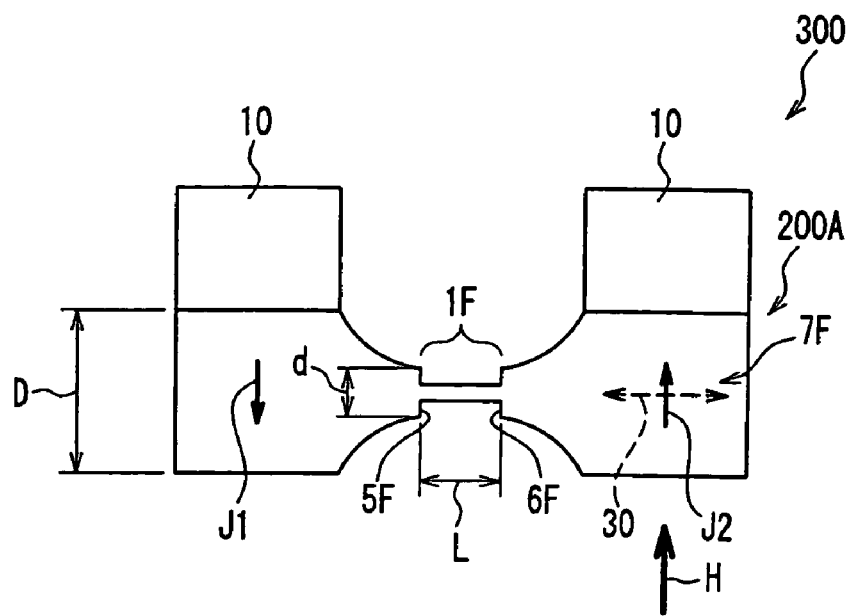
FIG. 5A is a plan view showing a magnetic head according to Embodiment 3.
Figure 5B:
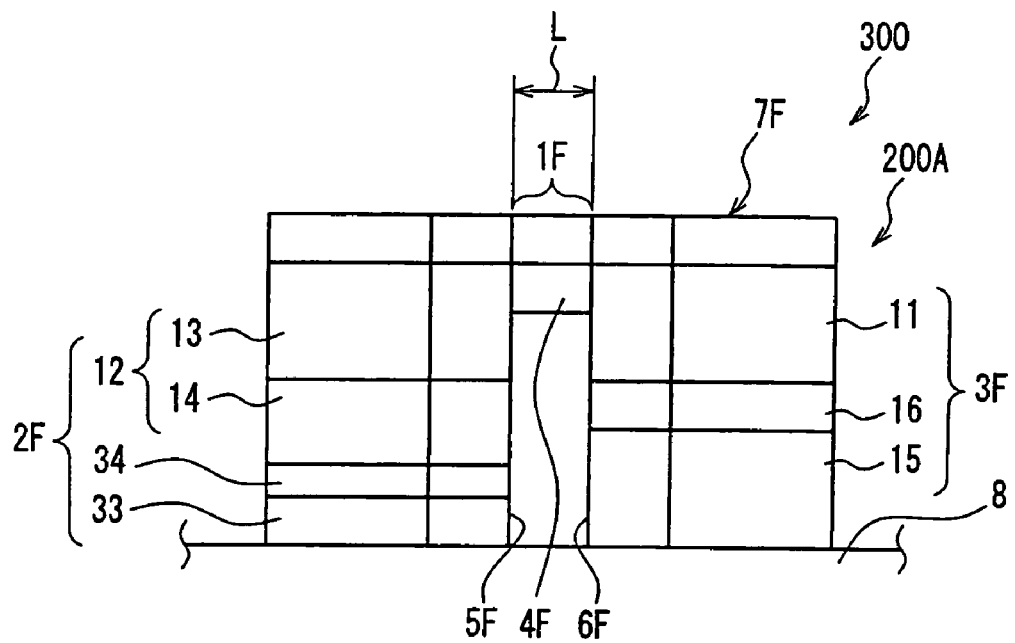
FIG. 5B is a front view showing a magnetic head according to Embodiment 3.

FIG. 5A is a plan view showing a magnetic head 300 according to Embodiment 3; and FIG. 5B is a front view thereof. The same components mentioned in Embodiments 1 and 2 are denoted with the same reference numerals, and the repeated description may be omitted.

The magnetic head 300 includes a magnetoresistance effect element 200A. The magnetoresistance effect element 200A includes the electrodes 2F and 3F composed of a magnetic substance. The electrodes 2F and 3F have the opposing surfaces 5F and 6F, respectively. The electrodes 2F and 3F include a curved portion having a width D that decreases toward the width d of the opposing surfaces 5F and 6F, respectively.

The magnetoresistance effect element 200A is provided with a cylindrical support 4F made of carbon nano-tube that bridges between the opposing surface 5F of the electrodes 2F and the opposing surface 6F of the electrodes 3F The magnetoresistance effect element 200A has a metal conductor thin film 7F electrically connected to the electrodes 2F and 3F. The metal conductor thin film 7F includes a metal conductor portion 1F. The metal conductor portion 1F bridges a gap between the electrodes 2 and 3 along the support 4A seen from the direction perpendicular to the bottom surface of the electrodes 2F and 3F. The bridge length L of the metal conductor portion 1F is not more than a value that is the larger of the value of the length of electron spin diffusion and the value of mean free path Λ of electron, in the metal conductor portion 1F at the operation temperature of the magnetoresistance effect element 200A.

The magnetic head 300 includes lead wires 10 that are electrically connected to the electrodes 2F and 3F of the magnetoresistance effect element 200A and applies voltage to both electrodes The electrode 3F includes an insulating film 15, a base film 16 that is made of Ta, etc. and formed on the insulating film 15, and a free layer 11 that is formed on the base film 16 and has a magnetization direction J2 rotating easily when the external magnetic field H is applied. The electrode 2F includes an insulating film 33, a base film 34 that is made of Ta, etc. and formed on the insulating film 34, and a pinned layer 12 that is formed on the base film 34 and has a magnetization direction J1 that does not easily rotate even if the external magnetic field H is applied. The pinned layer 12 includes an antiferromagnetic film 14 formed on the base film 34 and a magnetic film formed on the antiferromagnetic film 14 and pinned by the antiferromagnetic film 14.

The method for manufacturing the thus configured magnetoresistance effect element 300 will be described. Firstly, electrodes 2F and 3F are formed on a substrate 8 with a gap having a length of bridge L therebetween. Then, a lead wire 10 is connected to the electrodes 2F and 3F, respectively. Then, a catalyst for promoting a formation reaction of a carbon nano-tube is provided on the electrodes 2F and 3F. Next, the carbon nano-tube is allowed to grow from each catalyst by, for example, a chemical vapor deposition (CVD) method so as to bridge between the electrodes 2F and 3F, and thus a support 4F is formed. Thereafter, on the support 4F and on electrodes 2F and 3F, a metal conductor thin film 7F is deposited by, for example, a vapor deposition method, and thus the metal conductor portion 1F is formed along the support 4F.

By depositing the metal conductor thin film 7F on the support 4F of the carbon nano-tube, it is possible to form the metal conductor portion 1F having the bridge length L having a value that is larger value one the value of the length of electron spin diffusion and the value of mean free path Λ of electron.

This metal conductor portion 1F is in charge of electrical conduction between the electrodes 2F and 3F. This metal conductor portion 1F is made of metal. Therefore, unlike the carbon nano-tube of non-patent document 4 that is not capable of controlling the conductivity, the metal conductor portion 1F has a stable conductivity. Furthermore, since the metal conductor thin film 7F including a metal conductor portion IF is formed of metal, unlike the carbon nano-tube of non-patent document 4, contact resistance between the electrodes 2F and 3F becomes extremely small. Therefore, the electric property is stable, and a problem of a large contact resistance generated between the carbon nano-tube and the electrodes can be solved.

In the metal conductor portion 1F having the bridge length L that is not more than the larger of the length of electron spin diffusion and the mean free path Λ of electrons, a phenomenon called a ballistic conduction capable of allowing electrons to pass through the metal conductor portion 1F without being scattered is observed. By using the ballistic conduction, by controlling the magnetization direction J1 of the electrode 2F of the pinned layer 12 and the magnetization direction J2 of the electrode 3F of the free layer 11, a magnetoresistance effect element having an extremely high MR ratio can be obtained.

As shown in FIG. 5A, when the external magnetic field H is applied, the magnetization direction J1 of the pinned layer 12 of the electrode 2F is not rotated but the magnetization direction J2 of the free layer 11 of the electrode 3F is rotated in accordance with the magnitude of the external magnetic field H. Therefore, a difference in angle between the magnetization direction J1 and the magnetization direction J2 changes in accordance with the magnitude of the applied external magnetic field H and the resistance between the electrodes 2F and 3F is changed in accordance with the difference in angle between the magnetization directions J1 and J2. As a result, in accordance with the magnitude of the applied external magnetic field H, the resistance between the electrodes 2F and 3F of the magnetoresistance effect element 200A is changed.

When the pinned layer 12 is composed of the antiferromagnetic film 14 and a magnetic film pinned by the antiferromagnetic film 14, a magnetic head having a thermally stable property can be obtained.

Furthermore, the magnetic film is pinned with the antiferromagnetic film 14 in the example shown in FIG. 5B but it may contain a hard magnetic film having a large coercive force or a composite film of a hard magnetic film having a large magnetic force and a magnetic force. In this case, the antiferromagnetic film 14 is not necessary.

The magnetization direction of the magnetic layer provided in the pinned layer 12 must be fixed in one direction. However, in the magnetic head used for the application in which the recording density is more than 100 Gb/inch$^2$, the size of the element is extremely fine, so that the magnetization direction of the magnetic layer is affected by thermal fluctuation and it becomes difficult to fix the magnetization direction. Therefore, in this Embodiment, by the use of the antiferromagnetic film 14, the pinning of the magnetic film is carried out, and even if the size of element becomes fine, the magnetization direction of the magnetic layer is not affected by the thermal fluctuation.

It is desirable that a magnetization easy axis 30 of the free layer 11 is arranged so as to be perpendicular to the direction of the external magnetic field H to be detected. Thus, linearity of the signal output of the magnetoresistance effect element 200A is improved. One method for achieving this is providing permanent magnets on both sides of the free layer 11 and fixing the magnetization easy axis 30 of the free layer 11 so as to be perpendicular to the direction of the external magnetic field H to be detected by the bias magnetic field thereof. Another method for achieving this is pinning a part of the both ends of the free layer 11 by an antiferromagnetic film provided separately from the antiferromagnetic film 14 so that the magnetization easy axis 30 of the free layer 11 is made to be perpendicular to the direction of magnetic field H.

Furthermore, the free layer 11 is composed of two magnetic films that are exchange-bonded in anti-parallel to each other with a non-magnetic film interposed therebetween. When the magnetizations of the two magnetic layers are denoted by M1 and M2 and the film thickness are denoted by t1 and t2, (M1×t1−M2×t2) is not equal to zero. Thus, by the exchange bonding, it is possible to improve the stability with respect to a thermal fluctuation when the size of the element becomes fine and to improve the sensitivity of the magnetoresistance effect element with respect to an external magnetic field due to the reduction in the film thickness of effective magnetic film.

Like the free layer 11, magnetic film also may be composed of two magnetic films that are exchange bonded in anti-parallel to each other with a non-magnetic film interposed therebetween, thus improving the stability with respect to the thermal fluctuation. In the case of the magnetic film 13, (M1X×t1X−M2X×t2X) may be zero wherein M1X and M2X represent magnetization of the two respective magnetic films; and t1X and t2X represent the film thickness.

It is desirable that materials of the free layer 11 and the magnetic film 13 are metal/alloy containing Fe, Co and Ni as a main component. Specific examples of the materials include NiFe, CoFe and CoFeNi, etc. As a material of the antiferromagnetic film 14, an alloy film containing at least one element selected from the group consisting of Pt, Pd and Ir, and Mn element as a main component, for example, PtMn, IrMn and PtPdMn, are desirably used. The insulating films 15 and 33 may be composed of, for example, $SiO_2$. The insulating films 15 and 33 need not be formed. However, in the case where the insulating films 15 and 33 are formed, CNT can be grown smoothly.

Note here that by allowing the carbon nano-tube to bridge so as to form a support 4F while applying voltages that are different from each other to the electrodes 2F and 3F through the lead wires 10, it is possible to control the direction in which the carbon nano-tube is grown.

Embodiment 4

Figure 6:
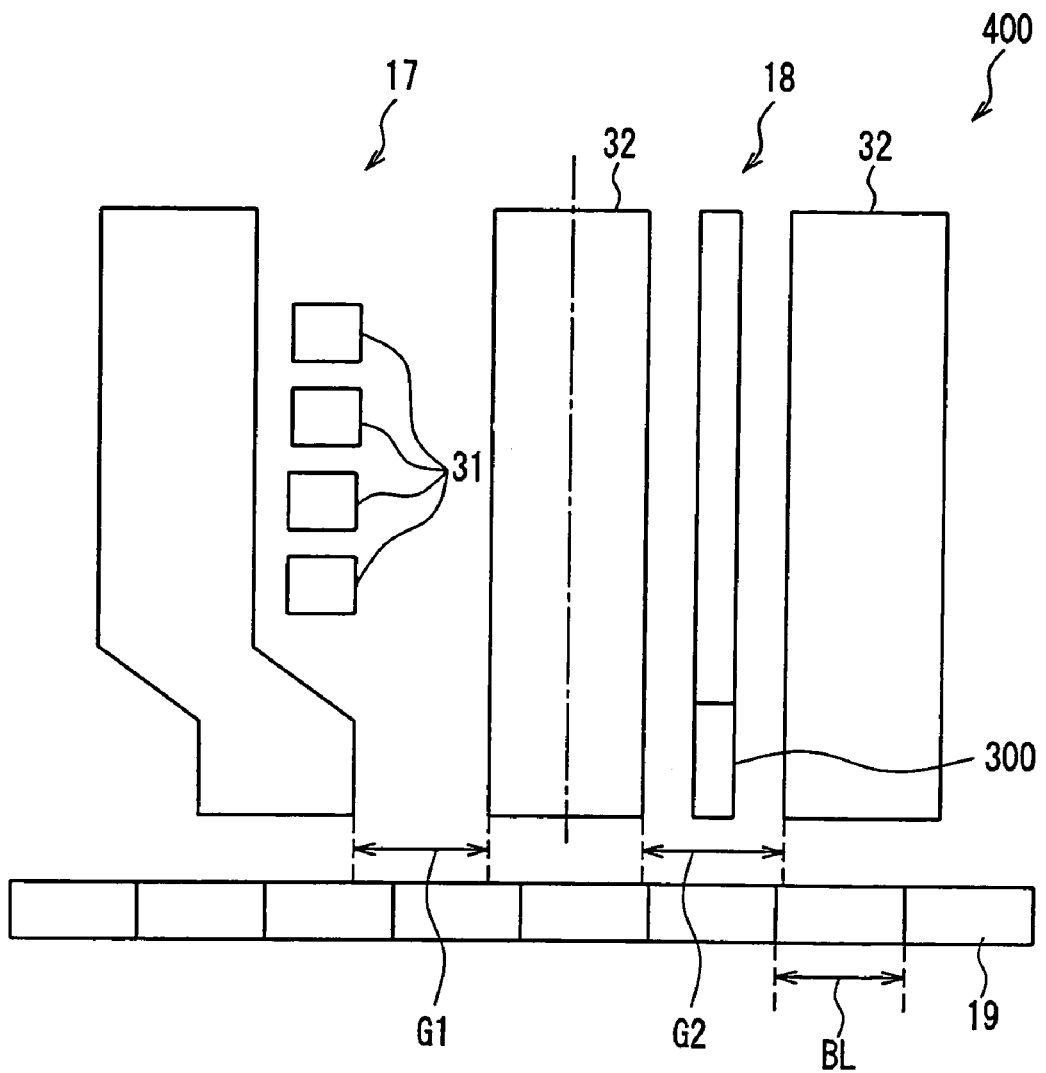
FIG. 6 is a front view showing a recording/reproducing apparatus according to Embodiment 4.

FIG. 6 is a front view showing a recording/reproducing apparatus 400 according to Embodiment 4. The recording/reproducing apparatus 400 includes a recording head portion 17 and a reproducing head portion 18. The recording head portion 17 has a winding portion 31. When electric current flows to the winding portion 31, a magnetic field is leaked from a recording gap G1, and with this leaked magnetic field, information is recorded in a magnetic recording medium 19.

The reproducing head portion 18 has two shield portions 32 including a magnetic substance, and a magnetic head 300 according to Embodiment 3 provided between the shield portions 32. A reading gap G2 between the shields portion 32 is set so as to be narrower than two times the bit length BL recorded in a magnetic recording medium 19. The information recorded in the magnetic recording medium 19 is detected by the magnetoresistance effect element 200A of the magnetic head 300 of Embodiment 3 and read out via lead wires 10 (see FIG. 5A).

The magnetic head 300 of the reproducing head portion 18 of Embodiment 4 includes a magnetoresistance effect element 200A of Embodiment 3. The magnetoresistance effect element 200A includes a metal conductor portion 1F (see FIGS. 5A and 5B). Since the bridge length L of the metal conductor portion 1F is a value that is no more than the larger of the value of the length of electron spin diffusion and the value of mean free path Λ of electron in the metal conductor portion, the ballistic conduction can be realized at the metal conductor portion 1F. Therefore, if the magnetic head 300 of the reproducing head portion 18 is used, since the MR ratio of 100% that is higher as compared with a conventional GMR element or TMR element, a recording/reproducing apparatus with super high density of more than 100 Gb/inch$^2$ can be realized.

Embodiment 5

Figure 7A:
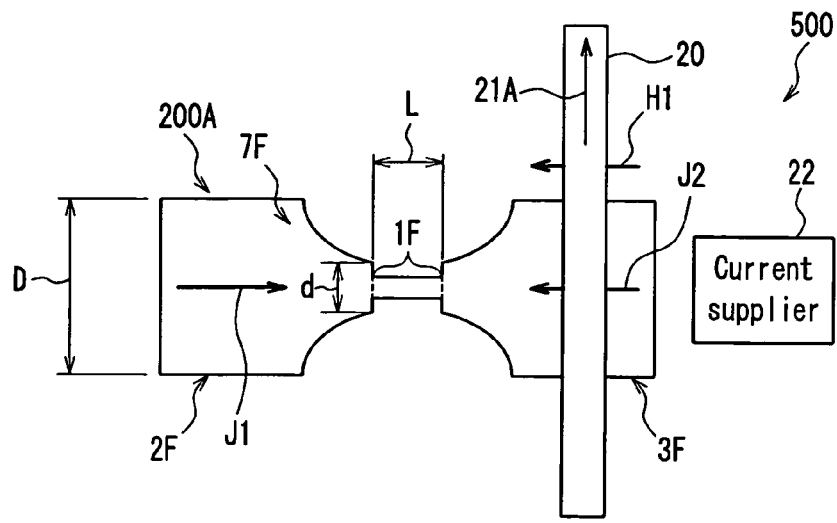
FIG. 7A is a plan view showing a first memory element according to Embodiment 5.
Figure 7B:
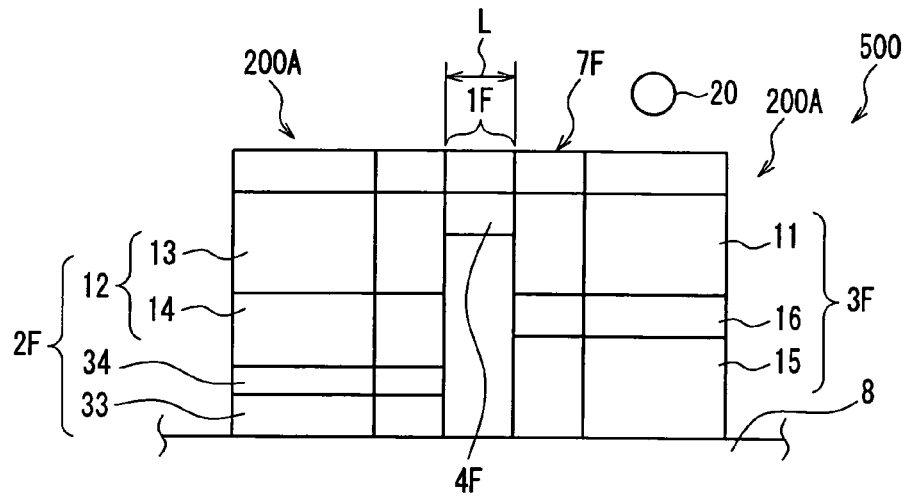
FIG. 7B is a front view showing a first memory element according to Embodiment 5.
Figure 7C:
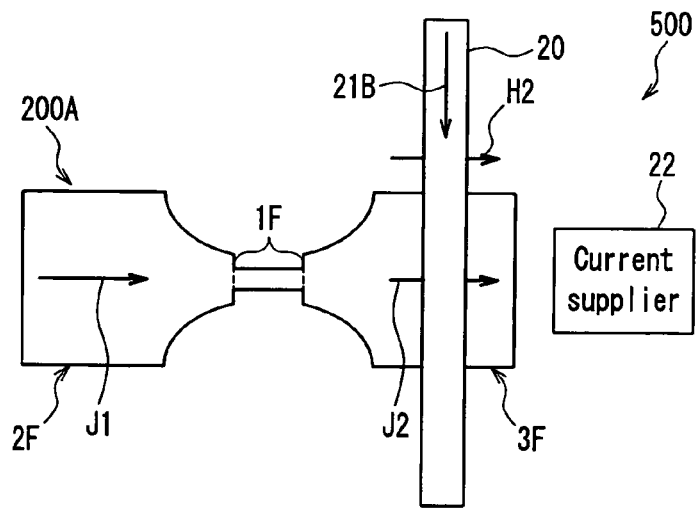
FIG. 7C is a plan view to explain an operation of the first memory element according to Embodiment 5.

FIG. 7A is a plan view showing a first memory element 500 according to Embodiment 5; FIG. 7B is a front view thereof, and FIG. 7C is a plan view to explain an operation of the first memory element 500 according to Embodiment 5. The same components as those mentioned in Embodiments 1 to 4 are denoted with the same reference numerals, and the repeated description may be omitted.

The memory element 500 includes a magnetoresistance effect element 200A mentioned in Embodiment 3 with reference to FIGS. 5A and 5B. The magnetoresistance effect element 200A includes an electrode 3F including a free layer 11 in which the magnetization is rotated easily with respect to the external magnetic field H; an electrode 2F including a pinned layer 12 in which the magnetization is not rotated easily with respect to the external magnetic field H; and a metal conductor thin film 7F including a metal conductor portion 1F. The pinned layer 12, the free layer 11 and the metal conductor portion 1F are composed of a magnetic substance.

In the metal conductor portion 1F having a bridge length L that is a value not more than a value that is the larger of the value of the length of electron spin diffusion and the value of mean free path Λ of electron, a phenomenon called a ballistic conduction capable of allowing electrons to pass through the metal conductor portion 1F without being scattered is observed. By using the ballistic conduction, by controlling the magnetization direction J1 of the pinned layer 12 of the electrode 2F and the magnetization direction J2 of the free layer 11 of the of the electrode 3F, a magnetoresistance effect element having an extremely high MR ratio can be obtained.

The memory element 500 further includes a word line 20 for generating an external magnetic field H1 or H2 that inverts the magnetization direction J2 of the free layer 11 based on any of the electric currents 21A and 21B; and a current supplier 22 for supplying the word line 20 with any of the electric currents 21A and 21B.

As shown in FIG. 7A, when the current supplier 22 supplies the word line 20 with an electric current 21A, the word line 20 generates an external magnetic field H1. The magnetization direction J1 of the pinned layer 12 is not magnetization-rotated in the direction of the external magnetic field H1, but the magnetization direction J2 of the free layer 11 is magnetization-rotated in the direction of the external magnetic field H1. Therefore, the magnetization direction J2 of the free layer 11 is in anti-parallel to the magnetization direction J1 of the pinned layer 12.

Then, as shown in FIG. 7C, when the electric current supplier 22 supplies the word line 20 with an electric current 21B flowing in the opposite direction to the electric current 21A, the word line 20 generates an external magnetic field H2 in the opposite direction to the external magnetic field H1. Then, the magnetization direction J2 of the free layer 11 is rotated in the direction of the external magnetic field H2. Therefore, the magnetization direction J2 of the free layer 11 becomes in parallel to the magnetization direction J1 of the pinned layer 12.

Thus, by flowing either electric current 21A or the electric current 21B to the word line 20 so as to rotate the magnetization direction J2 of the free layer 11, the parallel state and anti-parallel state can be achieved.

As shown in FIG. 7A, when the magnetization direction J1 and J2 of the both electrodes 2F and 3F are in anti-parallel to each other, when the magnetic substance is used for the metal conductor portion 1F, magnetic domain wall is pinned. Therefore, since electrons are scattered by the magnetic domain wall, the resistance between the both electrodes 2F and 3F becomes high. As shown in FIG. 7C, when the magnetization direction J1 and J2 of the both electrodes 2F and 3F are in parallel to each other, the magnetic domain wall disappears from the metal conductor portion 1F. Therefore, since electrons are not scattered by the magnetic domain wall, the resistance between the both electrodes 2F and 3F becomes low.

When the metal conductor portion 1F is composed of a non-magnetic substance, a magnetic domain wall is not generated in the metal conductor portion 1F. However, when the magnetization directions of the electrodes 2F and 3F are in parallel to each other, the metal conductor portion 1F shows the ballistic conduction; and when the magnetization directions of the electrodes 2F and 3F are in anti-parallel to each other, spin scattering occurred. Therefore, in accordance with whether the magnetization directions of the electrodes 2F and 3F are in parallel or anti-parallel to each other, the change in the magnetic resistance that is larger than that of the conventional GMR element can be obtained.

In the metal conductor portion 1F having a bridge length L that is a value not more than a value that is the larger of the value of the length of electron spin diffusion and the value of mean free path Λ of electron, a phenomenon called a ballistic conduction capable of allowing electrons to pass through the metal conductor portion 1F without being scattered can be realized. Therefore, the difference between the resistance in anti-parallel state shown in FIG. 7A and the resistance in parallel state shown in FIG. 7C becomes extremely large. Therefore, an extremely high MR ratio as compared with the MR ratio of a conventional magnetoresistance effect element having a maximum MR ratio of about 60% can be realized.

When allowing either electric current 21A or electric current 21B to flow in the word line 20, it is possible to write information "1" or "0" corresponding respectively to a state shown in FIG. 7A and a state shown in FIG. 7C in the free layer 11 of the electrode 3F. When the resistance between the both electrodes 2F and 3F is measured, it is possible to read the written information in accordance with whether there is high resistance or low resistance.

Figure 8A:
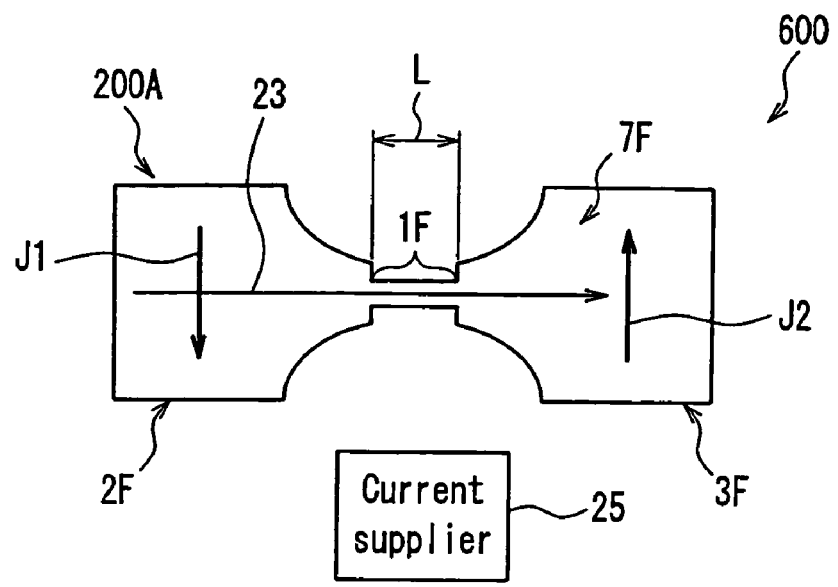
FIG. 8A is a plan view showing a second memory element according to Embodiment 5.
Figure 8B:
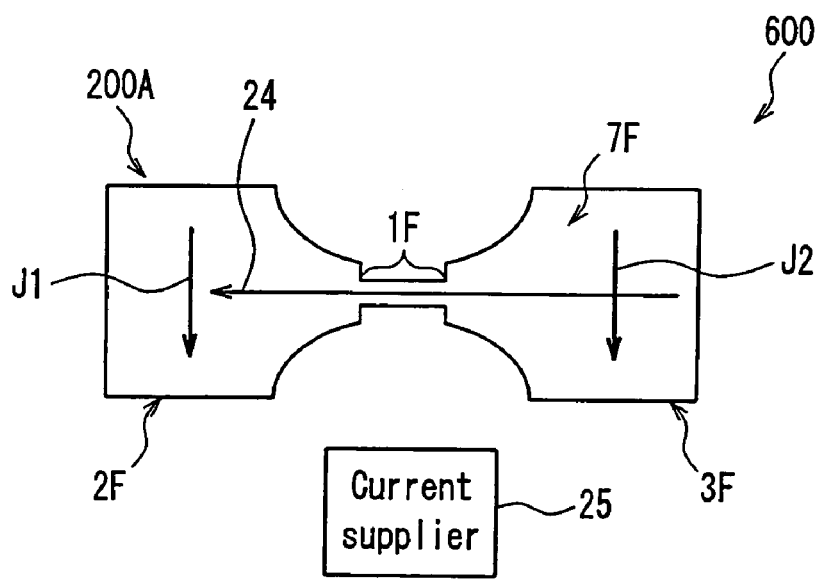
FIG. 8B is a plan view to explain an operation of the second memory element according to Embodiment 5.

FIG. 8A is a plan view showing a second memory element 600 according to Embodiment 5. FIG. 8B is a plan view to explain an operation of the second memory element 600.

The memory element 600 includes a magnetoresistance effect element 200A. As in the above-mentioned memory element 500, in the metal conductor portion 1F having a bridge length L that is a value not more than a value that is the larger of the value of the length of electron spin diffusion and the value of mean free path Λ of electron, a ballistic conduction capable of allowing electrons to pass through the metal conductor portion 1F without being scattered is observed. By using the ballistic conduction, by controlling the magnetization direction J1 of the pinned layer 12 of the electrode 2F and the magnetization direction J2 of the free layer 11 of the of the electrode 3F, a magnetoresistance effect element having an extremely high MR ratio can be obtained as compared with a conventional GMR element and TMR element.

The memory element 600 is provided with an electric current supplier 25. The electric current supplier 25 supplies the magnetoresistance effect element 200A with an electric current 23 flowing from the electrode 2F to the electrode 3F in the metal conductor portion 1F and an electric current 24 flowing from the electrode 3F to the electrode 2F in the metal conductor portion 1E. The basic configuration in this embodiment is the same as in the memory element 500 shown in FIGS. 7A to 7C except that a word line is not provided.

When the metal conductor portion 1F is a non-magnetic conductor, as shown in FIG. 8A, by allowing an electric current 23 to flow from the side of the electrode 2F including the pinned layer, the magnetization direction J2 of the free layer of the electrode 3F is in anti-parallel to the magnetization direction J1 of the pinned layer of the electrode 2F. As shown in FIG. 8B, by allowing an electric current 24 to flow from the side of the electrode 3F including the free layer, the magnetization direction J2 of the free layer of the electrode 3F is inversed and in the anti-parallel state with respect to the magnetization direction J1 of the pinned layer of the electrode 2F. Furthermore, when the metal conductor portion 1F is a magnetic substance, by allowing an electric current to flow from the electrode 3F or the electrode 2F, it is possible to pin the magnetic domain wall with respect to the metal conductor portion 1F or to remove the magnetic domain wall from the metal conductor portion 1F.

When the electric current 23 or 24 is allowed to flow to the magnetoresistance effect element 200A, it is possible to write information "1" or "0" corresponding respectively to a state shown in FIG. 8A and a state shown in FIG. 8B in the free layer of the electrode 3F. When the resistance between the both electrodes 2F and 3F is measured, it is possible to read the written information in accordance with whether there is high resistance or low resistance.

In order to invert the magnetization direction J2 of the electrode 3F by flowing electric current 23 or 24 in this way, the current density of the current 23 and 24 is at least $1 \times 10^5$ A/cm$^2$ or more and desirably $1 \times 10^6$ A/cm$^2$ or more for a stable operation.

When such a magnetoresistance element is manufactured by using a conventional lithography technology, since the width of the metal conductor portion is increased, a large current had to flow in order to increase the electric current density. Therefore, it was difficult to obtain a magnetoresistance effect element capable of saving energy.

In this embodiment, since the metal conductor portion is formed on the CNT, it is possible to reduce the width of the metal conductor portion to be 1 to 10 nm easily. Therefore, it is possible to realize the above-mentioned current density even without allowing a large current to flow. It is preferable that the current density of the electric current 23 and 24 is $1 \times 10^8$ A/cm$^2$ or less. If the current density is more than the upper limit, the memory element may be destroyed during operation.

The memory element 600 shown in FIGS. 8A and 8B do not need the word line, unlike the memory element 500 shown in FIGS. 7A to 7C. In the case of the magnetization reversal by an external magnetic field H using a word line, electric current of the word line necessary to the magnetization reversal was increased when the memory element became small, which was a serious problem. This memory element 600 is free from such a problem.

Since the memory element 600 does not need a word line as mentioned above, it has a configuration that is simple and has a small size. Thus, it is possible to realize a memory element that has a simple and small-sized configuration in which cell area is small, space for installing the memory is small and recording density is high. According to the memory element 600, an extremely high MR ratio as compared with the MR ratio of a conventional magnetoresistance effect element, in which the maximum MR ratio is about 60%.

Note here that the pinned layer 11 of the memory element shown in FIGS. 7A to 7C, 8A and 8B may be pinned by using an antiferromagnetic film provided below or above the pinned layer 11. It is preferable that this antiferromagnetic film contains at least one element selected from the group consisting of Pt, Pd and Ir and an alloy film containing Mn element as a main component, for example PtMn, IrMn and PtPdMn.

Figure 9:
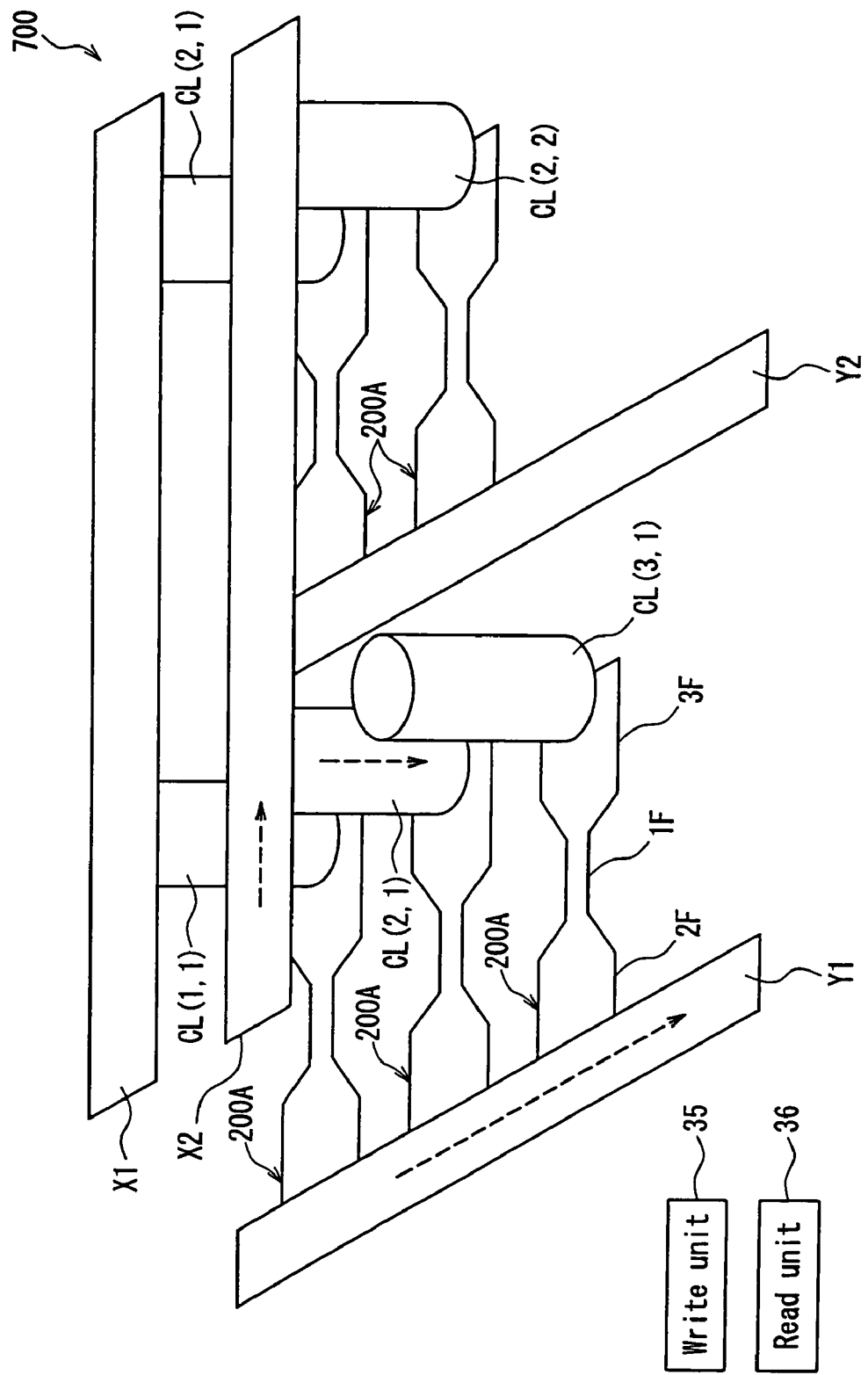
FIG. 9 is a perspective view showing a memory array according to Embodiment 5.

FIG. 9 is a perspective view showing a memory array 700 according to Embodiment 5.

As shown in FIG. 9, the memory elements of this embodiment mentioned with reference to FIGS. 8A and 8B are arranged in a matrix so as to make a memory element having a configuration capable of recording information on individual memory elements and reading out information from the individual memory elements. Thus, it is possible to realize a memory array whose density is higher than 1 Gb.

In the memory array 700, the magnetoresistance effect elements 200A are arranged in a matrix (m row×n column). Along the magnetoresistance effect elements 200A arranged in the column direction, M conductor lines X1, X2, . . . , X (m−1), Xm are provided. Connecting lines CL (i, j) ($1 \leq i \leq m$ and $1 \leq j \leq n$) for connecting the electrode 3F of each magnetoresistance effect element 200A and m conductive lines X1, X2, . . . , X (m−1), Xm are provided in a matrix. Then, n conductive lines Y1, Y2, . . . , Y (n−1), Yn connected to the electrodes 2F of the magnetoresistance effect elements 200A arranged in the direction of row are provided.

The memory array 700 includes a write unit 35. The write unit 35 writes information independently on the magnetoresistance effect element 200A via the conductive line and the connecting line by inversing the direction of the electric current flowing in the metal conductor portion 1F of the magnetoresistance effect element 200A so as to change the magnetization direction of the electrodes 2F and 3F in parallel or in anti-parallel.

The memory array 700 includes a read unit 36. The read unit 36 reads information written in the magnetoresistance effect element 200A independently by measuring the resistance value between the electrodes 2F and 3F of the magnetoresistance effect element 200A that are different in accordance with the magnetization direction of the electrodes 2F and 3F.

Information recording can be carried out by allowing a relatively large current to flow to the conductive line Xi, the connecting line CL (i, j), and the conductive line Yj. At this time, depending upon whether the direction in which the electric current is allowed to flow is from the side of the conductive line Xi or from the side of the conductive line Yj, the magnetization direction of the electrodes 2F and 3F become in a parallel state or in an anti-parallel state. If the magnetic substance is used for the metal conductor portion 1F, in the case of an anti-parallel state, a magnetic domain wall is pinned to the metal conductor portion and resistance becomes high; and in the case of a parallel state, a magnetic domain wall is removed from the metal conductor portion 1F and the resistance becomes low. When the metal conductor portion 1F is composed of a non-magnetic substance, a magnetic domain wall is not provided in the metal conductor portion 1E However, when the magnetization directions of the electrodes 2F and 3F are in parallel to each other, the metal conductor portion 1F shows a ballistic conduction and the resistance becomes low; and when the magnetization directions are in anti-parallel to each other, the spin diffusion occurs and the resistance becomes high.

Then, the resistance between both electrodes 2F and 3F is measured and the written information can be read out in accordance with whether the measurement resistance value is high or low.

An electric conduction between the electrodes 2F and 3F is established by the metal conductor portion 1F. This metal conductor portion 1F is made of metal. Therefore, unlike the carbon nano-tube of non-patent document 4 that is not capable of controlling the conductivity, the metal conductor portion 1F has a stable conductivity. Since the metal conductor thin film including the metal conductor portion 1F is made of metal, unlike the carbon nano-tube of non-patent document 4, contacting resistance between the electrode 2F and the electrode 3F is extremely small. Therefore, the electric property is stabilized and the problem of contact resistance occurred between the carbon nano-tube and the electrode is solved.

The bridge length L of the metal conductor portion 1F is not more than a value that is the larger of the value of the length of electron spin diffusion and the value of mean free path Λ of electron, in the metal conductor portion 1F, a phenomenon called a ballistic conduction capable of allowing electrons to pass through the metal conductor portion 1F without being scattered is observed. By using the ballistic conduction, a magnetoresistance effect element (BMR (ballistic MR)) having an extremely high MR ratio can be obtained as compared with conventional GMR element and TMR element. Thus, it is possible to realize a memory array 700 exhibiting higher output than that of a conventional MRAM.

Embodiment 6

Figure 10:
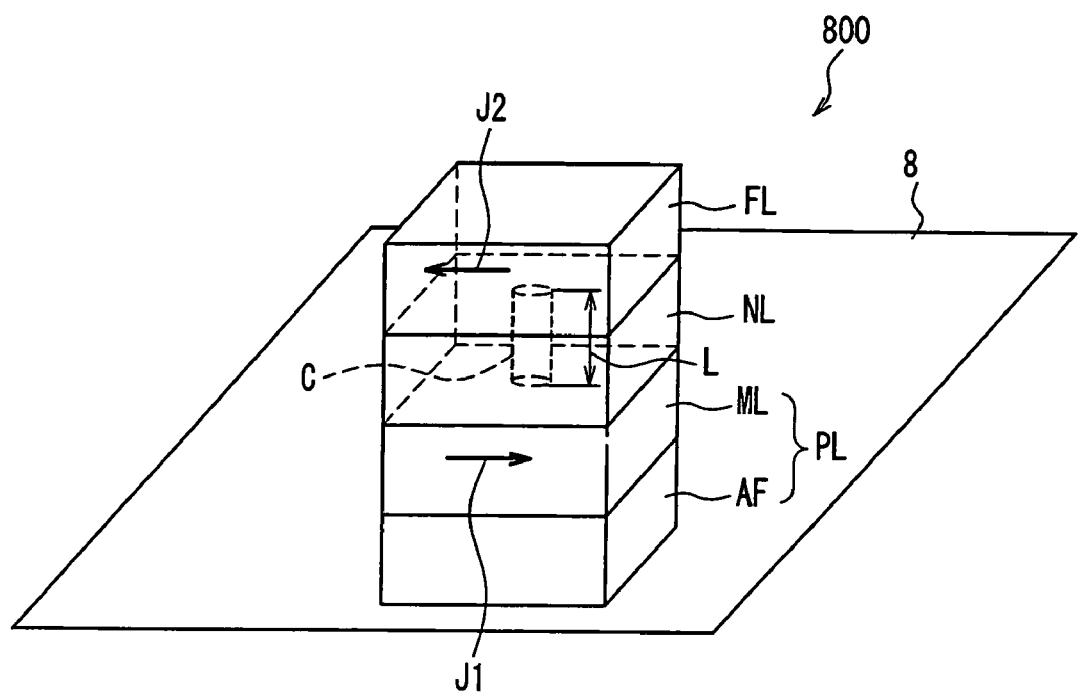
FIG. 10 is a perspective view showing a magnetoresistance effect element according to Embodiment 6.
Figure 11:
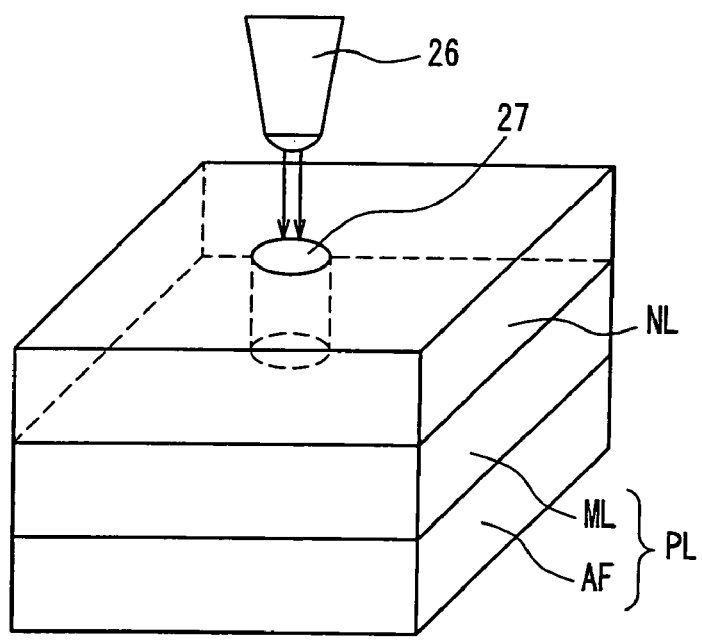
FIG. 11 is a perspective view to explain a method for manufacturing a magnetoresistance effect element according to Embodiment 6.

FIG. 10 is a perspective view showing a magnetoresistance effect element 800 according to Embodiment 6; and FIG. 11 is a perspective view to explain a method for manufacturing a magnetoresistance effect element 800 according to Embodiment 6.

The magnetoresistance effect element 800 includes a pinned layer (first electrode film) PL that is not easily magnetization-rotated with respect to an external magnetic field. The pinned layer PL includes an antiferromagnetic film AF and a magnetic film ML formed on the antiferromagnetic film AF and pinned by the antiferromagnetic film AF. On the magnetic film ML, a non-magnetic insulating film NL is formed. On the non-magnetic insulating film NL, a free layer (second electrode film) FL that is magnetization rotated with respect to the external magnetic filed easily is formed. The free layer FL is composed of a magnetic film.

The magnetoresistance effect element 800 includes a cylindrical shaped metal conductor C that penetrates the non-insulating film NL and connects the magnetic film ML and the free layer FL electrically. The metal conductor C is composed of a magnetic substance or nonmagnetic substance. The length L of the metal conductor C from the magnetic film Ml through the free layer FL is not more than the mean free path Λ of electrons of the metal conductor C at an operation temperature of the magnetoresistance effect element 800.

A method for manufacturing the thus configured magnetoresistance effect element 800 will be described. Firstly, the antiferromagnetic film AF and the magnetic film ML are formed on the substrate 8 in this order. Then, the non-magnetic insulating film NL is formed on the magnetic film ML to the thickness of the length L of the metal conductor C.

Next, a through hole 27 that reaches a magnetic film ML is formed by irradiating with field emission electron beams from a probe 26 of a scanning tunneling microscope (STM) including a carbon nano-tube. Then, the through hole 27 is filled with a metal conductor C. Then, a free layer FL is formed on the non-magnetic insulating film NL and a metal conductor C.

The probe 26 of SIM for irradiating with field emission electron beam is formed of a carbon nano-tube, and fine and precise processing can be carried out securely. Therefore, the through hole 27 having fine size and shape of 1 nm to 1000 nm and in particular 1 nm to 100 nm can be formed. Thus, it is possible to obtain a metal conductor C that is filled with the magnetic substance so as to have a fine size and shape.

In the metal conductor C having the length L of not more than the mean free path Λ of electron, a phenomenon called a ballistic conduction capable of allowing electrons to pass through the metal conductor C without being scattered and a phenomenon called a quantum conductance in which the conductivity changes stepwise with respect to the cross sectional area of the metal conductor C are observed.

By using the ballistic conduction, by controlling the magnetization direction J2 of the free layer FL and the magnetization direction J1 of the pinned layer PL, a magnetoresistance effect element having an extremely high MR ratio and a magnetic head using the magnetoresistance effect element, recording and reproducing apparatus, memory element and memory array can be obtained.

As shown in FIG. 10, if a magnetic substance is used for the metal conductor C, when the magnetization direction J2 of the free layer FL and the magnetization direction J1 of the pinned layer PL are in anti-parallel, a magnetic domain wall is pinned on the metal conductor C made of a magnetic substance, thus increasing the resistance between the free layer FL and the pinned layer PL. When the magnetization direction J2 of the free layer FL and the magnetization direction J1 of the pinned layer PL are in parallel, the magnetic domain wall disappears from the metal conductor C, and thereby the resistance between the free layer FL and the pinned layer PL is decreased. When a non-magnetic substance is used for the metal conductor C, a magnetic domain wall is not generated in the metal conductor portion. In accordance with whether the magnetization directions of the free layer FL and the pinned layer PL is in parallel to each other or in anti-parallel to each other, that is, when the magnetization direction is in parallel to each other, the resistance of the metal conductor C becomes low showing the ballistic conduction and when the magnetic direction is in anti-parallel to each other, the resistance becomes high due to the occurrence of the spin scattering. Therefore, it is possible to obtain the magnetoresistance effect element having a high MR ratio.

By changing the magnitude of the external magnetic field so as to cause the magnetization rotation of the free layer FL, the difference in angle between the fixed magnetization direction J1 of the pinned layer PL and the magnetization direction J2 of the free layer FL that is magnetization-rotated is changed and therefore, the resistance between the free layer FL and the pinned layer PL is changed. By using the magnetoresistance effect element 800, a magnetic head for detecting signals from the magnetic medium can be configured.

Furthermore, by allowing a large current to flow from the side of the free layer FL or from the side of the pinned layer PL so as to make the magnetization direction J2 of the free layer FL and the magnetization direction J1 of the pinned layer PL in parallel to each other or in anti-parallel to each other, information is written. Information is read out by using the fact that the resistances between the free layer FL and the pinned layer PL are different in accordance with whether the magnetization directions J1, J2 of the free layer FL and the pinned layer PL are in parallel to each other or in anti-parallel to each other, and thereby the memory element can be realized.

Furthermore, if the magnetoresistance effect element 200A arranged in a matrix shown in FIG. 9 is replaced by the magnetoresistance effect element 800, a large capacitance memory array can be realized. This is because the use of the magnetoresistance effect element 800, which allows an electric current to flow perpendicular to the film surface, can make a generally higher density than the magnetoresistance effect element 200A, which allows an electric current to flow in parallel to the film surface.

By using the quantum conductance, by controlling the cross sectional area of the metal conductor C, it is possible to obtain an electronic device free from variation in conductivity in mass production generated in the case where the conductivity with respect to the cross sectional area is changed linearly.

Furthermore, a semiconductor film having relatively high electric resistance, in which electric current flows only in the metal conductor C when an electric current flows to the magnetoresistance effect element 800, may be used instead of the non-magnetic insulating film NL.

Figure 12A:
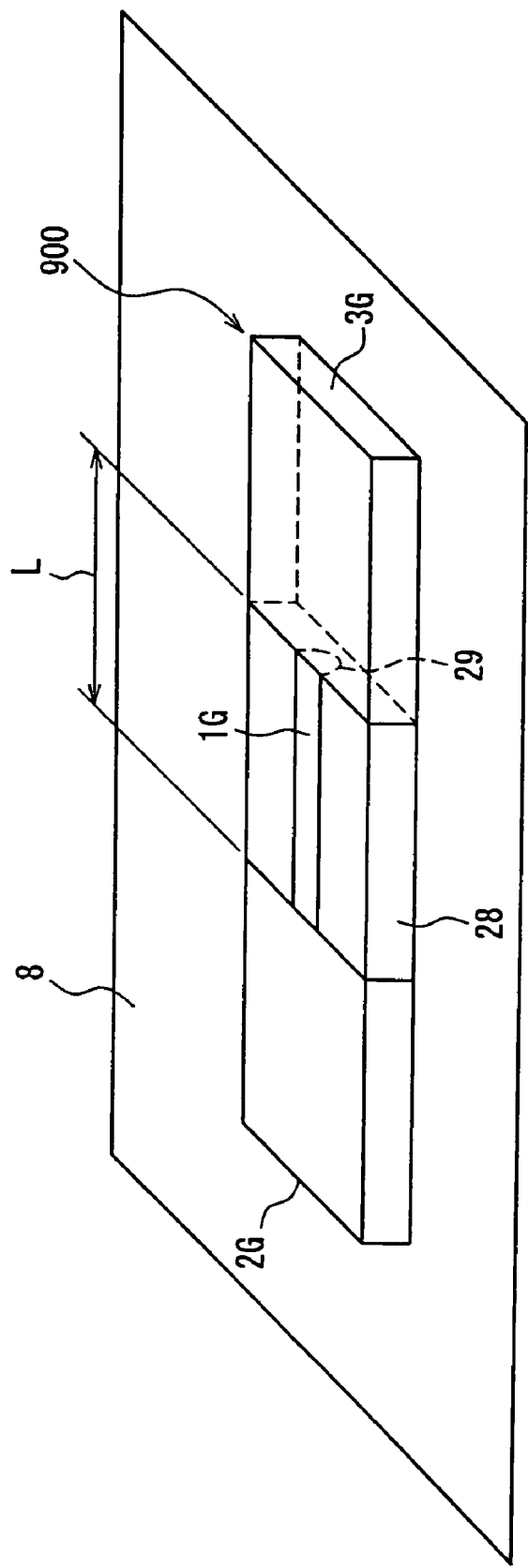
FIG. 12A is a perspective view to explain an electronic device according to Embodiment 6.
Figure 12B:
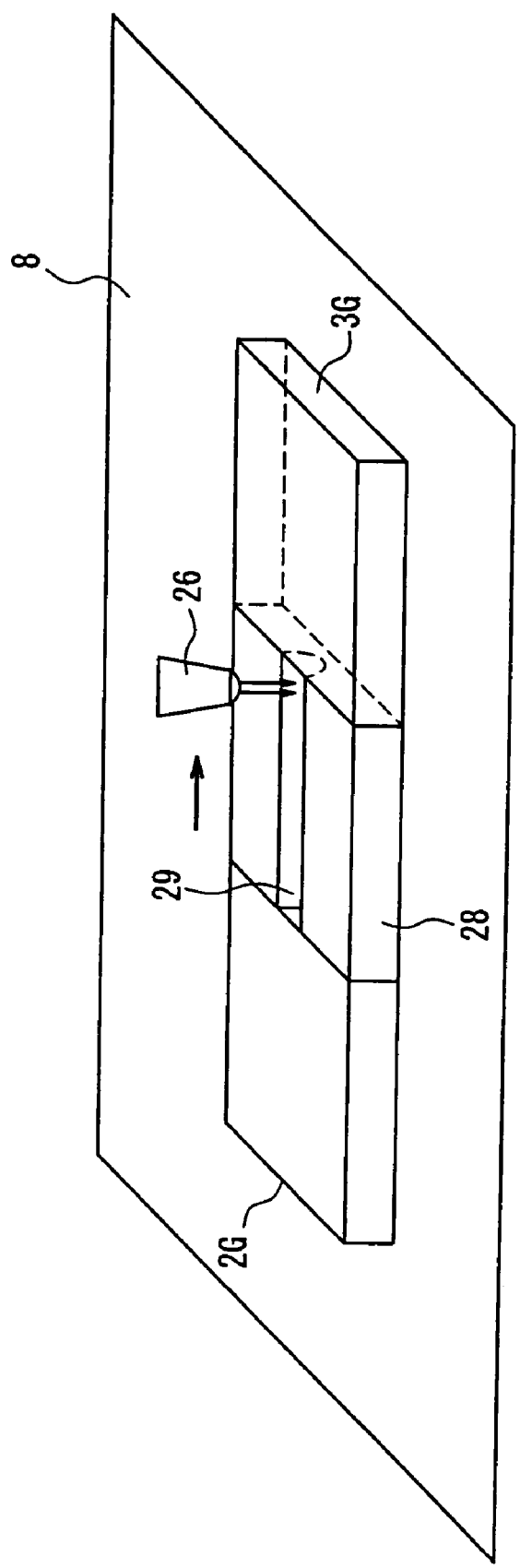
FIG. 12B is a perspective view to explain a method for manufacturing an electronic device according to Embodiment 6.

FIG. 12A is a perspective view to explain an electronic device 900 according to Embodiment 6. FIG. 12B is a perspective view to explain a method for manufacturing an electronic device 900.

The electronic device 900 includes electrodes 2G and 3G formed on the substrate 8; and an insulating film 28 formed in contact with the electrodes 2G and 3G between the electrodes 2G and 3G.

On the insulating film 28, a groove 29 that reaches from the electrode 2G to the electrode 3G is formed. The groove 29 is filled with a metal conductor 1G that is brought into contact with the electrodes 2G and 3G. The length L of the metal conductor 1G is not more than the mean free path Λ of electron in the metal conductor 1G at the operation temperature of the electronic device 900.

The method for manufacturing the thus configured electronic device 900 will be described. Firstly, the electrodes 2G and 3G disposed with a gap of the length L therebetween and the insulating film 28 are formed on the substrate 8. Then, the groove 29 is formed that reaches from the electrode 2G to the electrode 3G is formed on the insulating film 28 by irradiating the field emission electron beam while moving the probe 26 of STM including the carbon nano-tube. Then, the groove 29 is filled with the metal conductor 1G.

When the probe 26 of STM for irradiating with field emission electron beam is formed of a carbon nano-tube, fine and precise processing can be carried out securely. Therefore, the groove 29 having fine size and shape controlled in the order of 1 nm to 1000 nm and in particular 1 nm to 100 nm can be formed. Thus, it is possible to obtain a metal conductor 1G that is filled with the magnetic substance in a fine size and shape.

In the metal conductor 1G having the length L of not more than the mean free path Λ of electron, a quantum conductance and a ballistic conduction are observed.

By using the quantum conductance, by controlling the cross sectional area of the metal conductor portion 1G, an electronic device is free from variation in conductivity in mass production occurred in the case where the conductivity with respect to the cross sectional area is changed linearly. By using the ballistic conduction, by controlling the magnetization directions of the electrodes 2G and 3G, a magnetoresistance effect element having an extremely high MR ratio and a magnetic head, a recording/reproducing apparatus, a memory element, a memory array using the magnetoresistance effect element can be obtained.

Figure 13A:
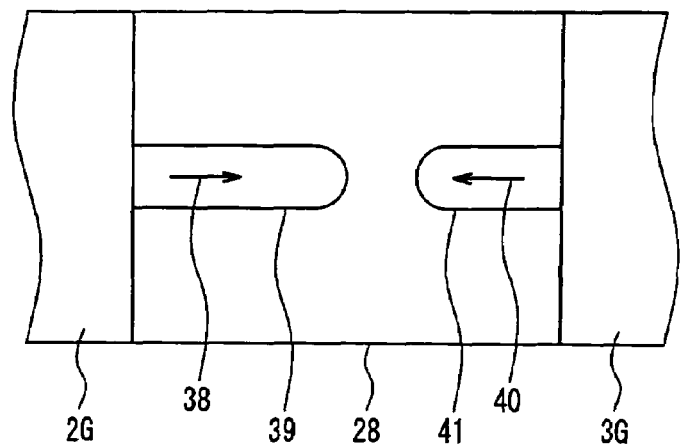
FIG. 13A is a plan view to explain a method for manufacturing another electronic device according to Embodiment 6.
Figure 13B:
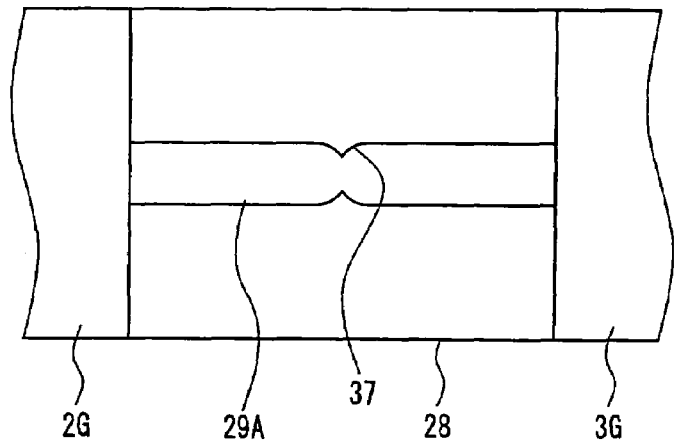
FIG. 13B is a plan view to explain a method for manufacturing another electronic device according to Embodiment 6.
Figure 13C:
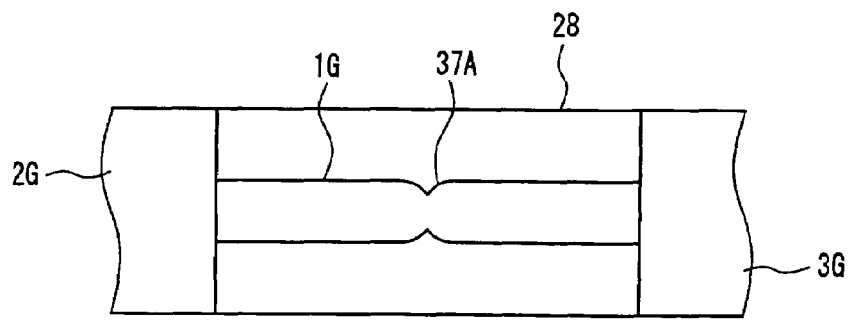
FIG. 13C is a plan view to explain a method for manufacturing another electronic device according to Embodiment 6.

The metal conductor 1G may be provided with a concave portion. Herein, the concave portion of the metal conductor is a portion in which the cross sectional area along the cross section perpendicular to the direction of the length L of the metal conductor is smaller than that of the other portion. The present inventors confirmed that the concave portion could be formed by using STM. As shown in FIG. 13A, a groove 39 is formed substantially in the center of the insulating film 28 by irradiating the insulating film 28 with field emission electron beams while moving the probe of STM in the direction from the side of the electrode 2G toward an arrow 38; and then a groove 41 is formed on the insulating film 28 by irradiating the insulating film 28 with field emission electron beams while moving the probe 26 of STM in the direction from the side of the electrode 3G toward an arrow 40 so as to allow the tip of the groove 41 to reach the tip of the groove 39. Thus, a groove 29A having a convex portion 37 as shown in FIG. 13B is formed. Thereafter, the groove 29A is filled with the metal conductor 1G so as to form a metal conductor 1G having a concave portion 37A. By forming the concave portion 37A, when the electronic device is used for the magnetoresistance effect element, if the magnetic substance is used for the metal conductor 1G, the magnetic domain wall can be pinned on the site of the convex portion 37A of the metal conductor 1G securely.

EXAMPLE 1

On a Si substrate, a $SiO_2$ layer was provided. On the $SiO_2$ layer, a pair of electrodes made of Mo/Au were formed with an interval of 50 nm by sputtering and EB lithography. Then, a catalyst containing fine particles of Ni having a diameter of about 5 nm was applied on the electrodes. Then, CNT having a length of 50 nm and a diameter of about 1 nm was grown in the lateral direction by a CVD method using $CH_4$ at 800° C. so as to bridge between the both electrodes and form a support. On the CNT and both electrodes, an Au film was deposited to the thickness of 1 nm so as to form a metal conductor portion on the CNT and thus an electronic device was formed.

Then, by varying the diameters of CNT from 2 nm, 5 nm, 10 nm and 20 nm, electronic devices were prepared. Specifically, an electronic device obtained by forming a 2 nm-thick metal conductor portion on the support in which a CNT having a diameter of 2 nm was grown; an electronic device obtained by forming a 5 nm-thick metal conductor portion on the support in which a CNT having a diameter of 5 nm was grown; an electronic device obtained by forming a 5 nm-thick metal conductor portion on the support in which a CNT having a diameter of 10 nm was grown; and an electronic device obtained by forming a 5 nm-thick metal conductor portion on the support in which a CNT having a diameter of 20 nm was grown were prepared. When voltage was applied to these electronic devices at the operation temperature of 77 K and the conductance was measured, it was shown that quantum conductance was an integral multiple of $G=2e^2/h$ that depends upon the size of CNT to be used in the formula mentioned above, wherein G denotes an electric conductivity (conductance); e denotes charge of electron; and h denotes Planck's constant.

EXAMPLE 2

On a Si substrate, a $SiO_2$ layer was provided. On the $SiO_2$ layer, an electrode made of Ta/NiFe/CoFe and an electrode made of Ta/PtMn/CoFe were formed with an interval of 10 nm by sputtering and EB lithography. Then, a Co thin film, which serves as a catalyst, having a thickness of 0.5 nm was deposited on these electrodes. Then, CNT having a length of 10 nm and a diameter of about 20 nm was grown in the lateral direction by a CVD method using $CH_4$ at 400° C. so as to bridge between the both electrodes and form a support.

On the CNT and both electrodes, a Co film was deposited to the thickness of 3 nm so as to form a metal conductor portion on the CNT and thus a magnetoresistance effect element 200A shown in FIGS. 5A and 5B was formed. The magnetoresistance effect element was formed so that the maximum width of the both electrodes was set to 120 nm and the width was decreased toward the metal conductor portion. Lead wires were connected to these electrodes and thus a magnetic head 300 shown in FIGS. 5A and 5B was prepared. When, at the operation temperature of 300 K, a certain voltage was applied and an external magnetic field was varied from 1 kOe to −1 kOe, it was shown that the MR ratio was about 500%.

EXAMPLE 3

By using the magnetic head prepared in Example 2, a reproducing head portion having a reproducing track width of 120 nm was prepared. A recording/reproducing apparatus having a recording head portion and reproducing head portion shown in FIG. 6 was prepared. As the magnetic recording medium, $CoCrPt-SiO_2$ based perpendicular magnetic recording medium was used. It was shown that information recorded on the magnetic recording medium with recording density of 200 Gb/inch$^2$ was able to be reproduced from this reproducing head portion at the operation temperature of 300 K

EXAMPLE 4

On a Si substrate, a $SiO_2$ layer was provided. On the $SiO_2$ layer, an electrode made of Ta/NiFe/CoFe and an electrode made of Ta/PtMn/CoFe were formed with an interval of 15 nm by sputtering and EB lithography. Then, a Co thin film, which serves as a catalyst, having a thickness of 0.5 nm was deposited on these electrodes. Then, CNT having a length of 15 nm and a diameter of about 6 nm was grown in the lateral direction by a CVD method using $CH_4$ at 450° C. so as to bridge between the both electrodes and form a support.

On the CNT and both electrodes, a Co film was deposited to the thickness of 3 nm so as to form a metal conductor portion on the CNT and thus a magnetoresistance effect element 200A shown in FIGS. 5A and 5B was formed. The magnetoresistance effect element was formed so that the maximum width of the both electrodes was set to 80 nm and the width was decreased toward the metal conductor portion. Lead wires were connected to these electrodes and thus a magnetic head 300 shown in FIGS. 5A and 5B was prepared. When, at the operation temperature of 77 K, a certain voltage was applied and an external magnetic field was varied from 1 kOe to −1 kOe, it was shown that the MR ratio was about 1000%.

EXAMPLE 5

On a Si substrate, an electrode made of Ta/NiFe/CoFe and an electrode made of Ta/PtMn/CoFe were formed with an interval of 50 nm by sputtering. Then, a Co thin film having a thickness of 0.5 nm was deposited on these electrodes. Then, CNT having a length of 50 nm and a diameter of about 20 nm was grown in the lateral direction by a CVD method using $CH_4$ at 450° C. so as to bridge between the both electrodes and form a support. Note here that the film thickness of both electrodes is made about 20 nm.

On the CNT and both electrodes, a 10 nm thick Cu film was deposited so as to form a metal conductor portion on the CNT and thus a magnetoresistance effect element 200A as shown in FIGS. 5A and 5B was prepared. The magnetoresistance effect element 200A was prepared so that the maximum width of the both electrodes was set to 200 nm and the width was decreased toward the metal conductor portion. Lead wires were connected to these electrodes and thus a magnetic head was prepared. When, at the operation temperature of 77 K, a certain voltage was applied and an external magnetic field was varied from 1 kOe to −1 kOe, it was shown that the MR ratio was about 100%.

By using the magnetic head, a reproducing head portion having a reproducing track width of 200 nm was prepared. A recording/reproducing apparatus having a reproducing head portion and the recording head portion shown in FIG. 6 was prepared. As a magnetic recording medium, $CoCrPt$—$SiO_2$ based perpendicular magnetic recording medium was used. It was shown that information recorded on the magnetic recording medium with a recording density of 120 $Gb/inch^2$ was able to be reproduced from this reproducing head portion at the operation temperature of 300 K.

EXAMPLE 6

On the electrode 3F of the magnetoresistance effect element 200A shown in FIGS. 5A and 5B prepared in Example 4, a word line made of Cu insulated from the electrode 3F was formed and thus the memory element 500 shown in FIGS. 7A to 7C were prepared. By changing the direction in which an electric current is allowed to flow in the word line, information of "1" or "0" is written in the electrode 3F and then the resistance between the both electrodes of the magnetoresistance effect element was examined. It was shown that the resistance changes in accordance with the information of "1" or "0"; the written information is nonvolatile; this memory element is capable of nondestructive reading and information can be written in the electrode 3F repeatedly $10^{10}$ times or more.

EXAMPLE 7

The memory element 600 shown in FIGS. 8A and 8B was prepared by using the magnetoresistance effect element 200A shown in FIGS. 5A and 5B prepared in Example 4. When, at the operation temperature of 300 K, by making the density of electric current flowing in the metal conductor portion was about $1 \times 10^7$ $A/cm^2$ and by allowing an electric current 23 to flow from the side of the electrode 2F having a pinned layer as shown in FIG. 8A or by flowing current 24 from the side of the electrode 3F having a free layer as shown in FIG. 8B, information of "1" or "0" is written. When the resistance value of both the electrodes 2F and 3F of the magnetoresistance effect element was examined, it was shown that the resistance changes in accordance with the information of "1" or "0"; the written information is nonvolatile. This memory element is capable of nondestructive reading and information can be written in the magnetoresistance effect element repeatedly $10^{10}$ times or more.

EXAMPLE 8

The magnetoresistance effect element 200A of the memory element 600 prepared in Example 7 is arranged in a matrix as shown in FIG. 9 so as to prepare a large capacity of memory array 700. At the operation temperature of 300 K, by appropriately selecting one of the m row×n column of magnetoresistance effect element 200A, by making the density of electric current flowing in the conductive line and the connecting line be about $1 \times 10^7$ $A/cm^2$ and by flowing current from the side of the electrode 2F of the magnetoresistance effect element 200A or from the side of the electrode 3F thereof, information of "1" or "0" is written in the selected magnetoresistance effect element 200A. When the resistance value of both the electrodes of the magnetoresistance effect element was the examined, it was shown that the resistance changes in accordance with the information of "1" or "0"; the written information is nonvolatile. This memory element is capable of nondestructive reading and information can be written in the magnetoresistance effect element repeatedly $10^{10}$ times or more.

EXAMPLE 9

On a substrate, Ta base film was formed by sputtering, an antiferromagnetic film AF made of PtMn and a magnetic film ML made of CoFe were formed so as to prepare the pinned layer PL. Then, on the magnetic film ML, an Al film was formed by sputtering, and with natural oxidizing thereof, so a non-magnetic insulating film NL that is an $Al_2O_3$ oxide film having a thickness of 3 nm was prepared.

Then, as shown in FIG. 11, by applying voltage to a non-magnetic insulating film NL of $Al_2O_3$ oxide film, a fine hole having a diameter of 5 nm is formed by irradiating with field emission electron beam from a probe of a STM including a carbon nano-tube. Then, a CoFe film was formed thereon by sputtering to form a free layer FL and at the same time, the hole formed on the above-mentioned $Al_2O_3$ oxide film was filled with CoFe to form a metal conductor C. The free layer FL and the pinned layer PL thus were electrically connected to each other. This element was patterned to the width of 80 nm by EB lithography to prepare the magnetoresistance effect element 800 shown in FIG. 10.

Then, on the free layer FL of the magnetoresistance effect element 800, a word line made of Cu was arranged via the insulating film. Then, at the operation temperature of 300 K, an electric current is allowed to flow in the word line to generate the magnetic field causing the magnetization reversal of the free layer FL. When the resistance of the magnetoresistance effect element 800 was measured, it was shown that the resistance changes whether the magnetization direction of the free layer FL and the magnetization direction of the pinned layer PL are in parallel or in anti-parallel. It was confirmed that this element operated as a memory element 500 as shown in FIGS. 7A and 7C.

Then, an electric current is allowed to flow to the metal conductor C formed by filling a fine hole with CoFe so that the current density was about $1 \times 10^7$ $A/cm^2$. In accordance with whether the direction of allowing an electric current to flow is from the side of the free layer FL or from the side of the pinned layer PL, it was confirmed that the magnetization direction of the free layer FL is inverted; that the resistance between the pinned layer PL and the free layer FL of this element is changed; and that this element operated as a memory element 600 shown in FIGS. 8A to 8B.

EXAMPLE 10

On a substrate, a 5 nm thick Ta-base layer was formed by the same method as in Example 9, a 20 nm thick antiferromagnetic film AF made of PtMn and a 3 nm/0.7 nm/3 nm-thick magnetic film ML made of CoFe/Ru/CoFe were formed so as to prepare a pinned layer PL. Then, on the magnetic film ML, an Al film was formed by sputtering and natural oxidizing thereof, so an $Al_2O_3$ oxide film having a thickness of 5 nm was prepared as a non-magnetic insulating film NL.

Then, as shown in FIG. 11, by applying voltage to a non-magnetic insulating film NL of $Al_2O_3$ oxide film, a fine hole having a diameter of about 10 nm was formed by irradiating with a field emission electron beam from a probe of a STM including a carbon nano-tube. Then, a Cu film was formed thereon by sputtering. The hole formed on the above-mentioned $Al_2O_3$ oxide film was filled with Cu to form a metal conductor C. Then, CoFe/NiFe/Ru/NiFe film having a thickness of 1 nm/2 nm/0.4 nm/2 nm was formed by sputtering so as to form a free layer FL. This free layer FL and the pinned layer PL were electrically connected to each other. This element was patterned to the width of 160 nm by EB lithography to prepare the magnetoresistance effect element 800 shown in FIG. 10.

To the free FL and to the pinned layer PL, a lead wire was connected so as to prepare a magnetic head. When a constant voltage was applied and an external magnetic field was varied from 1 kOe to −1 kOe, it was shown that the MR ratio was about 200%.

By using this magnetic head, a reproducing head portion having a reproducing track width of 160 nm was prepared. A recording/reproducing apparatus having the reproducing head portion and the recording head portion shown in FIG. 6 was prepared. As a magnetic recording medium, CoCrPt—$SiO_2$ based perpendicular magnetic recording medium was used. It was shown that information recorded in the magnetic recording medium with recording density of 150 Gb/inch$^2$ was able to be reproduced from this reproducing head portion at the operation temperature of 300 K On the free layer FL of the magnetoresistance effect element 800, a word line made of Cu was arranged via the insulating film. Then, at the operation temperature of 77 K, an electric current is allowed to flow in the word line to generate the magnetic field causing the magnetization reversal of the free layer FL. When the resistance of the magnetoresistance effect element 800 was measured, it was shown that the resistance changes whether the magnetization direction of the free layer FL and the magnetization direction of the pinned layer PL were in parallel or in anti-parallel. It was confirmed that this element operated as a memory element 500 as shown in FIGS. 7A to 7C.

Then, an electric current is allowed to flow to the metal conductor C formed by filling a fine hole with Cu so that the current density was about $1\times10^7$ A/cm$^2$. It was confirmed that in accordance with whether the direction of allowing an electric current to flow was from the side of the free layer FL or from the side of the pinned layer PL, the magnetization direction of the free layer FL is changed; that the resistance between the pinned layer PL and the free layer FL of this element was changed and; that this element operated as a memory element 600 shown in FIGS. 8A to 8B.

EXAMPLE 11

On an insulating substrate, an Au film was formed by sputtering. The Au film was patterned so as to form electrodes 2G and 3G with an interval of 100 nm as shown in FIG. 12A.

Then, an insulating film 28 including $SiO_2$ film was formed between the electrodes 2G and 3G by sputtering.

As shown in FIG. 12B, by applying voltage to the insulating film 28 so as to irradiate an insulating film 28 with field emission field emission electron beams while scanning a probe 26 of SIM including CNT having a diameter of 1 nm on the insulating film 28, a part of the insulating film 28 was removed so as to form a fine groove 29 reaching from the electrode 2G to the electrode 3G with the depth of 2 nm. Then, an Au film was formed on the insulating film 28 by sputtering and the groove 29 formed on the insulating film 28 was filled with an Au film so as to form a metal conductor 1G electrically connected to the electrodes 2G to 3G. Thus, an electronic device 900 was formed.

Furthermore, electronic devices were formed by varying diameters of the CNT of the probe 26 of STM from 2 nm, 4 nm, 6 nm, 8 nm and 10 nm. Specifically, an electronic device obtained by forming a 2 nm-deep groove with a probe of STM of CNT having a diameter of 2 nm and filling the groove with a metal conductor; an electronic device obtained by forming a 2 nm-deep groove with a probe of STM of CNT having a diameter of 4 nm and filling the groove with a metal conductor; an electronic device obtained by forming a 5 nm-deep groove with a probe of STM of CNT having a diameter of 6 nm and filling the groove with a metal conductor; an electronic device obtained by forming a 5 nm-deep groove with a probe of STM of CNT having a diameter of 8 nm; and an electronic device obtained by forming a 5 nm-deep groove with a probe of STM of CNT having a diameter of 10 nm were formed.

When voltage was applied to these electronic devices and each conductance was measured, it was confirmed that quantum conductance that was an integral multiple of $G=2e^2/h$ each depending upon the size of the metal conductor was shown.

Furthermore, it was confirmed that by controlling the magnetization direction of the electrodes 2G and 3G, the resistance between the electrodes 2G and 3G was changed, and that the electronic device operated as a magnetoresistance effect element having a high MR ratio and the memory element.

EXAMPLE 12

On a substrate, a Ta based film was formed by sputtering, an antiferromagnetic film AF made of PtMn and a magnetic film ML made of NiFe were formed so as to form a pinned layer PL. Then, on the magnetic film ML, an Al film was formed by sputtering, and natural oxidizing thereof, so an $Al_2O_3$ oxide film having a thickness of 3 nm was prepared as a non-magnetic insulating film NL.

Then, as shown in FIG. 11, by applying voltage to a non-magnetic insulating film NL of $Al_2O_3$ oxide film, a fine hole having a diameter of 5 nm was formed by irradiating with field emission electron beams from a probe of a STM including a carbon nano-tube. Then, a NiFe was formed thereon by sputtering to form a free layer FL and at the same time, the hole formed on the above-mentioned $Al_2O_3$ oxide film was filled with NiFe to form a metal conductor C and then the free layer FL and the pinned layer PL were electrically connected to each other. This element was patterned to the width of 80 nm by EB lithography to prepare the magnetoresistance effect element 800 shown in FIG. 10.

Then, on the free layer FL of the magnetoresistance effect element 800, a word line made of Cu was arranged with the insulating film interposed therebetween. Then, at the operation temperature of 300 K, an electric current was allowed to flow in the word line to generate the magnetic field causing the magnetization reversal of the free layer FL. When the resistance of the magnetoresistance effect element 800 was measured, it was shown that the resistance changes whether the magnetization direction of the free layer FL and the magnetization direction of the pinned layer PL were in parallel or in anti-parallel. It was confirmed that this element operated as a memory element 500 as shown in FIGS. 7A to 7C.

Then, an electric current was allowed to flow to the metal conductor C formed by filling a fine hole with NiFe so that the current density was about $1 \times 10^7$ A/cm$^2$. In. accordance with whether the direction of allowing an electric current to flow was from the side of the free layer FL or from the side of the pinned layer PL, it was confirmed that the magnetization direction of the free layer FL was inverted, the resistance between the pinned layer PL and the free layer FL of this element was changed and that this element operated as a memory element 600 shown in FIGS. 8A to 8B.

The present invention can be applied to an electronic device having a fine shape controlled on the order of nanometers, a magnetoresistance effect element having a fine shape controlled in the nanometer order; a magnetic head, a recording/reproducing apparatus, a memory element and a memory array using the magnetoresistance effect element; a method for manufacturing the electronic device; and a method for manufacturing the magnetoresistance effect element.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An electronic device, comprising:
   a first electrode film;
   an insulating film formed on the first electrode film;
   a second electrode film formed on the insulating film; and
   a metal conductor penetrating the insulating film and electrically connecting the first electrode film and the second electrode film,
   wherein the first electrode film, the insulating film, and the second electrode film are layered such that the insulating film is sandwiched between the first electrode film and the second electrode film, and
   a length L of the metal conductor is not more than a mean free path $\Lambda$ of electron in the metal conductor at an operation temperature of the electronic device.

2. The electronic device according to 1, wherein the first electrode film and the second electrode film comprise a magnetic substance; and the metal conductor is provided with a concave portion.

3. The electronic device according to claim 1, wherein the length L of the metal conductor is not more than 5 nm.

4. The electronic device according to claim 1, wherein the metal conductor comprises a magnetic substance; and
   wherein the length L of the metal conductor is not more than 3 nm.

5. An electronic device, comprising:
   a first electrode;
   a second electrode; and
   an insulating film formed in contact with the first electrode and the second electrode between the first electrode and the second electrode,
   wherein the insulating film is provided with a groove that reaches from the first electrode to the second electrode,
   the groove is filled with a metal conductor that is brought into contact with the first electrode and the second electrode, and
   a length L of the metal conductor is not more than a mean free path $\Lambda$ of electron in the metal conductor at an operation temperature of the electronic device.

6. The electronic device according to 5, wherein the first electrode and the second electrode comprise a magnetic substance; and the metal conductor is provided with a concave portion.

7. The electronic device according to claim 5, wherein the length L of the metal conductor is not more than 5 nm.

8. The electronic device according to claim 5, wherein the metal conductor comprises a magnetic substance; and
   wherein the length L of the metal conductor is not more than 3 nm.

9. A magnetoresistance effect element, comprising:
   a first electrode film;
   an insulating film formed on the first electrode film;
   a second electrode film formed on the insulating film; and
   a metal conductor penetrating the insulating film and electrically connecting the first electrode film and the second electrode film,
   wherein the first electrode film, the insulating film, and the second electrode film are layered such that the insulating film is sandwiched between the first electrode film and the second electrode film;
   wherein a length L of the metal conductor is not more than a mean free path $\Lambda$ of electron in the metal conductor at an operation temperature of the magnetoresistance effect element, and
   wherein both of the first electrode film and the second electrode film comprise a magnetic substance.

10. The magnetoresistance effect element according to claim 9, wherein the first electrode film comprises a free layer,
    the free layer including a first magnetization,
    wherein the first magnetization is rotated easily with respect to an external magnetic field,
    the second electrode film comprises a pinned layer,
    the pinned layer including a second magnetization,
    wherein the second magnetization is not rotated easily with respect to the external magnetic field, and
    a magnetization easy axis of the free layer is perpendicular to the direction of the external magnetic field to be detected.

11. The magnetoresistance effect element according to claim 10, wherein the pinned layer comprises an antiferromagnetic film; and a magnetic film is formed on the antiferromagnetic film and pinned by the antiferromagnetic film, and
    the magnetic film is electrically connected to the metal conductor.

12. The magnetoresistance effect element according to claim 9, wherein the metal conductor comprises at least one element selected from the group consisting of Fe, Co, and Ni.

13. The magnetoresistance effect element according to claim 9, wherein the first electrode film comprise at least one element selected from the group consisting of Fe, Co and Ni, and
    wherein the second electrode film comprise at least one element selected from the group consisting of Fe, Co and Ni.

14. The magnetoresistance effect element according to claim 9, wherein the operation temperature of the magnetoresistance effect element is 4.2 K or more and 523 K or less.

15. A magnetic head, comprising:
the magnetoresistance effect element according to claim 9;
a first lead wire electrically connected to the first electrode film of the magnetoresistance effect element; and
a second lead wire electrically connected to the second electrode film of the magnetoresistance effect element.

16. A recording/reproducing apparatus, comprising:
a recording head for recording information in a magnetic media; and
a reproduring head for reproducing information recorded on the magnetic media,
wherein the reproducing head includes the magnetic head according to claim 15.

17. A memory element, comprising:
the magnetoresistance effect element according to claim 9,
wherein the first electrode film of the magnetoresistance effect element comprises a free layer, the free layer including a first magnetization, wherein the first magnetization is rotated easily with respect to an external magnetic field, and
wherein the second electrode film comprises a pinned layer, the pinned layer including a second magnetization, wherein the second magnetization is not rotated easily with respect to the external magnetic field;
a word line generating an external magnetic field that changes the magnetization directions of the free layer and the pinned layer in parallel or in anti-parallel, based on an electric current; and
an electric current supplier for supplying the word line with the electric current,
wherein the word line generates the external magnetic field that changes the first magnetization in a parallel direction or in an anti-parallel direction with respect to the second magnetization wherein information is written in the magnetoresistance effect element, and
wherein a resistance value of the magnetoresistance effect element is measured to read out the information written in the magnetoresistance effect element.

18. A memory element, comprising:
the magnetoresistance effect element according to claim 9,
wherein the magnetic substance of the first electrode film includes a first magnetization direction, and the magnetic substance of the second electrode film includes a second magnetization direction; and
an electric current supplier that supplies an electric current flowing in the metal conductor portion in a first current flow direction and a second current flow direction,
wherein the first current flow direction is from the first electrode film toward the second electrode film, and
wherein the second current flow direction is from the second electrode film toward the first electrode film,
wherein the first current flow direction changes the first magnetization direction and the second magnetization direction to be in parallel, and the second current flow direction changes the first magnetization direction and the second magnetization direction to be in anti-parallel, such that information is written in the magnetoresistance effect element,
wherein the magnetoresistance effect element includes a first resistance value when the first magnetization direction and the second magnetization direction are in parallel, and a second resistance value, when the first magnetization direction and the second magnetization direction are in anti-parallel, and
wherein the first resistance value and the second resistance value are measured to read out the information written in the magnetoresistance effect element.

19. The memory element according to claim 18, wherein a current density of the electric current is $1.0 \times 10^5$ A/cm$^2$ or more.

20. A memory array, comprising:
a plurality of the magnetoresistance effect elements according to claim 9, wherein the plurality of the magnetoresistance effect elements are arranged in a matrix;
a wiring for writing information in the magnetoresistance effect element independently and reading out information in the magnetoresistance effect element;
a write unit for writing information in the magnetoresistance effect element independently via the wiring by inverting a direction of an electric current flowing in the metal conductor portion of the magnetoresistance effect element to change magnetization directions of the first electrode film and the second electrode film, wherein the magnetization directions of the first electrode film and the second electrode film are in parallel or in anti parallel with respect to each other; and
a read unit for reading out independently the information written in the magnetoresistance effect element via the wiring by measuring resistance value of the magnetoresistance effect element, wherein the resistance value includes a first resistance value when the first electrode film and the second electrode film are in parallel with respect to each other, and a second resistance value when the first electrode film and the second electrode film are in anti-parallel with respect to each other.

21. A magnetoresistance effect element, comprising:
a first electrode;
a second electrode; and
an insulating film formed in contact with the first electrode and the second electrode between the first electrode and the second electrode,
wherein the insulating film is provided with a groove that reaches from the first electrode to the second electrode,
wherein the groove is filled with a metal conductor that is brought into contact with the first electrode and the second electrode,
wherein a length L of the metal conductor is not more than a mean free path Λ of electron in the metal conductor at an operation temperature of the magnetoresistance effect element, and
wherein both of the first electrode and the second electrode comprise a magnetic substance.

22. The magnetoresistance effect element according to claim 21, wherein the first electrode comprises a free layer, the free layer including a first magnetization,
wherein the first magnetization is rotated easily with respect to an external magnetic field,
the second electrode comprises a pinned layer, the pinned layer including a second magnetization,
wherein the second magnetization is not rotated easily with respect to the external magnetic field, and
a magnetization easy axis of the free layer is perpendicular to the direction of the external magnetic field to be detected.

23. The magnetoresistarice effect element according to claim 22, wherein the pinned layer comprises an antiferromagnetic; and a magnetic is formed on the antiferroniagnetic and pinned by the antiferromagnetic , and
the magnetic is electrically connected to the metal conductor.

24. The magnetoresistance effect element according to claim 21, wherein the metal conductor comprises at least one element selected from the group consisting of Fe, Co, and Ni.

25. The magnetoresistance effect element according to claim 21, wherein the first electrode comprise at least one element selected frdm the group consisting of Fe, Co and Ni, and
wherein the second electrode comprise at least one element selected from the group consisting of Fe, Co and Ni.

26. The magnetoresistance effect element according to claim 21, wherein the operation temperature of the magnetoresistance effect element is 4.2 K or more and 523 K or less.

27. A magnetic head, comprising:
the magnetoresistance effect element according to claim 21; a first lead wire electrically connected to the first electrode of the magnetoresistance effect element; and
a second lead wire electrically connected to the second electrode of the magnetoresistance effect element.

28. A recording/reproducing apparatus, comprising:
a recording head for recording information in a magnetic media; and
a reproducing head for reproducing information recorded on the magnetic media,
wherein the reproducing head includes the magnetic head according to claim 27.

29. A memory element, comprising:
the magnetoresistance effect element according to claim 21
wherein the first electrode of the mngnetoresistance effect element comprises a free layer, the free layer including a first magnetization, wherein the first magnetization is rotated easily with respect to an external magnetic field, and
wherein the second electrode comprises a pinned layer, the pinned layer including a second magnetization, wherein the second magnetization is not rotated easily with respect to the external magnetic field;
a word line generating an external magnetic field that changes the magnetization directions of the free layer and the pinned layer in parallel or in anti-parallel, based on an electric current; and
an electric current supplier for supplying the word line with the electric current,
wherein the word line generates the external magnetic field that changes the first magnetization in a parallel direction or in an anti-parallel direction with respect to the second magnetization wherein information is written in the magnetoresistance effect element, and
wherein a resistance value of the magnetoresistance effect element is measured to read out the information written in the magnetoresistance effect element.

30. A memory element, comprising:
the magnetoresistance effect element according to claim 21,
wherein the magnetic substance of the first electrode includes a first magnetization direction, and the magnetic substance of the second electrode includes a second magnetization direction; and
an electric current supplier that supplies an electric current flowing in the metal conductor portion in a first current flow direction and a second current flow direction,
wherein the first current flow direction is from the first electrode toward the second electrode, and
wherein the second current flow direction is from the second electrode toward the first electrode,
wherein the first current flow direction changes the first magnetization direction and the second magnetization direction to be in parallel, and the second current flow direction changes the first magnetization direction and the second magnetization direction to be in anti-parallel, such that information is written in the magnetoresistance effect element,
wherein the magnetoresistance effect element includes a first resistance value when the first magnetization direction and the second magnetization direction are in parallel, and a second resistance value, when the first magnetization direction and the second magnetization direction are in anti-parallel, and
wherein the first resistance value and the second resistance value are measured to read out the information written in the magnetoresistance effect element.

31. The memory element according to claim 30, wherein a current density of the electric current is $1.0 \times 10^5 A/cm^2$ or more.

32. A memory array, comprising:
a plurality of the magnetoresistance effect elements according to claim 21, wherein the plurality of the magnetoresistance effect elements are arranged in a matrix;
a wiring for writing information in the magnetoresistance effect element independently and reading out information in the magnetoresistance effect element;
a write unit for writing information in the magnetoresistance effect element independently via the wiring by inverting a direction of an electric current flowing in the metal conductor portion of the magnetoresistance effect element to change magnetization directions of the first electrode and the second electrode, wherein the magnetization directions of the first electrode and the second electrode are in parallel or in anti parallel with respect to each other; and
a read unit for reading out independently the information written in the magnetoresistance effect element via the wiring by measuring resistance value of the magnetoresistance effect element, wherein the resistance value includes a first resistance value when the first electrode and the second electrode are in parallel with respect to each other, and a second resistance value when the first electrode and the second electrode are in anti-parallel with respect to each other.

* * * * *